US011846665B2

(12) United States Patent
Zhang et al.

(10) Patent No.: US 11,846,665 B2
(45) Date of Patent: Dec. 19, 2023

(54) ONLINE AND OFFLINE PARTIAL DISCHARGE DETECTION FOR ELECTRICAL DRIVE SYSTEMS

(71) Applicant: General Electric Company, Schenectady, NY (US)

(72) Inventors: Lili Zhang, Mason, OH (US); Karim Younsi, Ballston Lake, NY (US); Christopher Michael Calebrese, Ashland, MA (US); John Russell Yagielski, Scotia, NY (US); Han Xiong, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/412,343

(22) Filed: Aug. 26, 2021

(65) Prior Publication Data

US 2022/0065915 A1 Mar. 3, 2022

Related U.S. Application Data

(60) Provisional application No. 63/072,615, filed on Aug. 31, 2020.

(51) Int. Cl.
*G01R 31/00* (2006.01)
*G01R 31/12* (2020.01)
*G01R 31/34* (2020.01)

(52) U.S. Cl.
CPC ....... *G01R 31/1227* (2013.01); *G01R 31/008* (2013.01); *G01R 31/343* (2013.01)

(58) Field of Classification Search
CPC ............ G01R 31/1227; G01R 31/1209; G01R 31/1218; G01R 31/18; G01R 31/12;
(Continued)

(56) References Cited

U.S. PATENT DOCUMENTS 6,617,859 B1  9/2003  Orton
6,937,027 B2  8/2005  Koo et al.
(Continued)

FOREIGN PATENT DOCUMENTS

DE  2991221 U1  12/2000
EP  0520193 A1  12/1992
(Continued)

*Primary Examiner* — Tarun Sinha
*Assistant Examiner* — James I Burris
(74) *Attorney, Agent, or Firm* — Dority & Manning, P.A.

(57) ABSTRACT

Aspects of the present disclosure are directed to systems and methods for detecting Partial Discharge (PD) associated with wide bandgap semiconductor-based electrical drive systems in real time. In one aspect, signals, including noise associated with drive switching and other background noises are detected using a sensing device. The signals are received by a real-time spectrum analyzer. The spectrum analyzer transforms the signals into the frequency domain and determines or registers the frequency domain profiles of the signals. The spectrum analyzer performs signal discrimination between at least one other signal included within the signals and switching noise based on their frequency domain profiles. Based on the discrimination analysis, the presence of a partial discharge signal may be detected. A physics-based signal discrimination approach can also be used for signal discrimination, for example utilizing pressure-dependency of characteristics of a PD signal.

20 Claims, 9 Drawing Sheets

(58) Field of Classification Search
CPC .... G01R 31/008; G01R 31/00; G01R 31/343; G01R 31/34; G01R 31/1272; G01R 31/083; G01R 23/16; B64D 27/24; B64D 27/16; B64F 5/60

See application file for complete search history.

(56) References Cited

U.S. PATENT DOCUMENTS

| | | | |
|---|---|---|---|
| 8,466,690 | B2 | 6/2013 | Stewart et al. |
| 8,674,642 | B2 | 3/2014 | Shaver et al. |
| 10,571,504 | B2 * | 2/2020 | Lee ................ G01R 31/343 |
| 2011/0184672 | A1 * | 7/2011 | Hagiwara ........... G01R 31/14 |
| | | | 702/58 |
| 2017/0059643 | A1 * | 3/2017 | Bierman ........... G01R 31/1272 |
| 2018/0313887 | A1 | 11/2018 | Zhang et al. |
| 2019/0324075 | A1 * | 10/2019 | Kinsella ............ G01R 15/183 |

FOREIGN PATENT DOCUMENTS

| | | | | |
|---|---|---|---|---|
| EP | 1418437 | A1 | 5/2004 | |
| EP | 3187842 | B1 * | 9/2018 | ............. G01H 1/00 |
| FR | 3056301 | A1 * | 3/2018 | ........... G01R 31/008 |
| GB | 2429790 | A | 3/2007 | |
| GB | 2536989 | A * | 10/2016 | ........... G01R 15/186 |
| JP | 2018/036113 | A | 3/2018 | |
| KR | 101200052 | B1 | 11/2012 | |
| KR | 101553005 | B1 | 10/2015 | |
| KR | 101569145 | B1 | 7/2016 | |
| KR | 20180070208 | A | 6/2018 | |

\* cited by examiner

ONLINE AND OFFLINE PARTIAL DISCHARGE DETECTION FOR ELECTRICAL DRIVE SYSTEMS

CROSS REFERENCE TO RELATED APPLICATIONS

The present application claims the benefit of U.S. Provisional Patent Application Ser. No. 63/072,615, filed on Aug. 31, 2020, which is incorporated herein by reference in its entirety.

FIELD

The present subject matter relates generally to systems and methods for detecting partial discharge associated with electrical drive systems.

BACKGROUND

Electrical drive systems, such as those found in aircraft electric and hybrid-electric propulsion systems, can employ various power electronics for the control and/or conversion of electrical power. The power electronics can include wide bandgap electronics, such as wide bandgap semiconductors, for example. Such power electronics-based electrical drive systems can offer dynamic speed control and greater energy efficiency, among other benefits. However, there are certain challenges associated with such electrical drive systems.

For instance, repetitive fast switching pulses, or so-called Pulse Width Modulated (PWM) waveforms, contain high frequency contents that impose significant challenges to electrical insulation systems of electrical drive systems. For instance, the PWM voltage frequency spectrum overlaps with the frequency band that is used to detect Partial Discharge (PD), which has conventionally made PD difficult to detect with consistency. For power electronics, the presence of PD may lead to severe degradation of insulating materials and other packaging materials that do not have PD resistance. Accordingly, PWM fed electric machines may suffer from premature insulation failure as a result of PD and dielectric overheating. Components of electrical drive systems for aircraft are particularly susceptible to PD degradation at high altitudes, such as greater than 38,000 ft.

Conventional PD monitoring equipment and analyzers have not been able to detect PD signals in a satisfactory manner, especially sporadic PD signals. For instance, conventional systems have typically analyzed signals in the time domain space and have utilized high frequency filters synchronized with voltage signal triggering. Such an approach is neither reliable nor typically sensitive enough for PD detection under PWM. Applying such filters can cause the low frequency bands of the PD signals to become lost or strongly attenuated. Moreover, the PD signal may not correlate with the synchronized voltage signal. In this regard, time domain recognition of PD signals from noise may be difficult. Thus, detected PD signals are sometimes not fully representative of the actual PD signals, and consequently, incorrect PD inception voltages can be reported, particularly for high altitude/low pressure applications.

Accordingly, systems and methods that address one or more of the challenges noted above would be useful.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
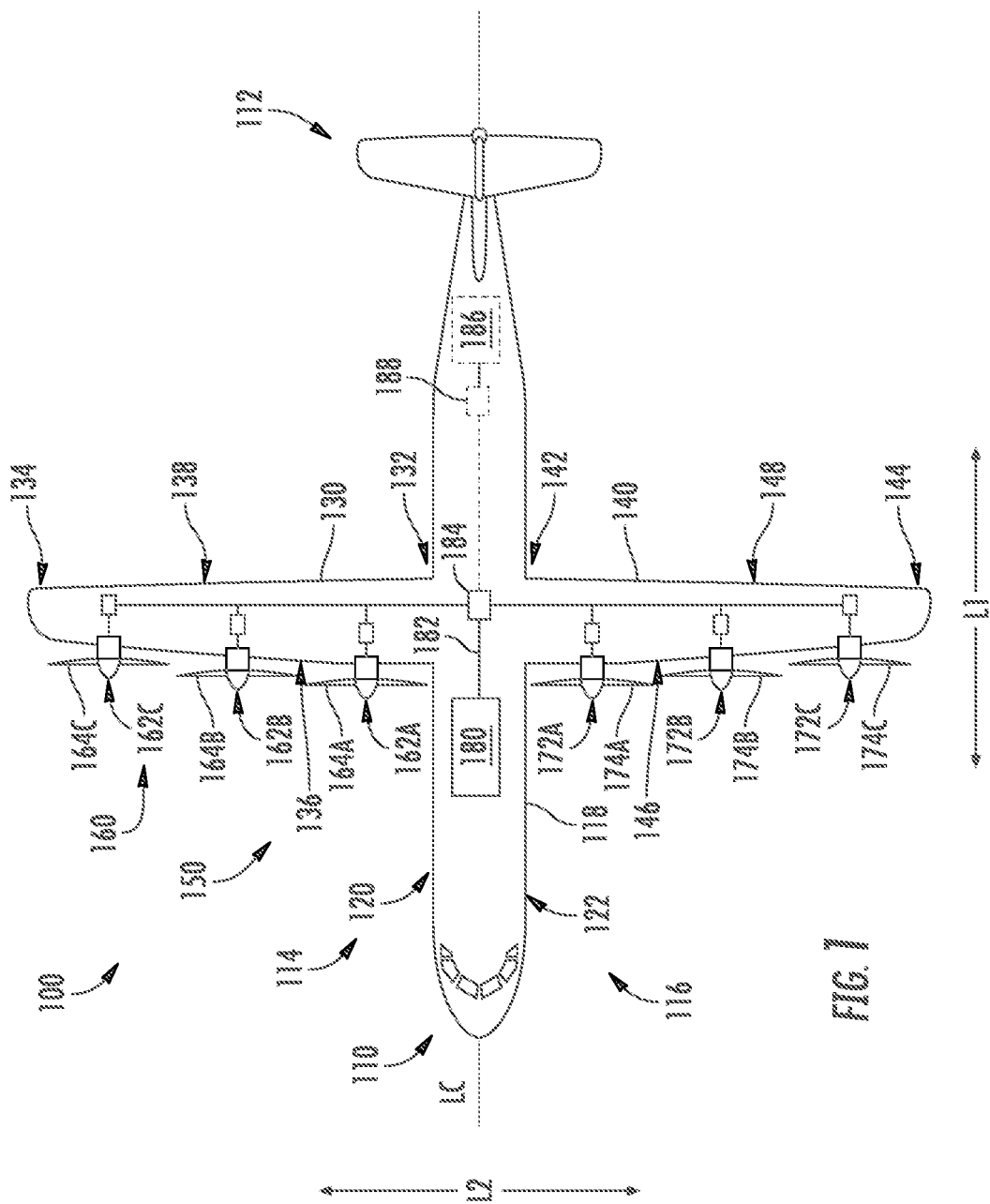
FIG. 1 provides a schematic top plan view of an aircraft according to an example embodiment of the present disclosure.

Reference will now be made in detail to present embodiments of the invention, one or more examples of which are illustrated in the accompanying drawings. The detailed description uses numerical and letter designations to refer to features in the drawings. Like or similar designations in the drawings and description have been used to refer to like or similar parts of the invention. As used herein, the terms "first," "second," and "third" may be used interchangeably to distinguish one component from another and are not intended to signify location or importance of the individual components.

Aspects of the present disclosure are directed to systems and methods for detecting partial discharge associated with power electronics-based electrical drive systems, such as power electronics-based electrical drive systems of a propulsion system for an aircraft. In one aspect, a system includes an electrical drive system having an electric machine and an electric drive electrically coupled with the electric machine. The electric drive controls the electrical power provided to the electric machine. The electric machine can be operatively coupled with a load machine, such as a propulsor for an aircraft. The system also includes a data acquisition system. The data acquisition system includes a sensing device operable to sense signals associated with the electrical drive system. The signals can include noise associated with drive switching and other background noises. The signals can also include a partial discharge signal.

The signals are received by a real-time spectrum analyzer of the data acquisition system that is configured to detect the partial discharge signal, or more broadly, whether partial discharge is present within the system. Particularly, the spectrum analyzer transforms the sensed signals from the time domain into the frequency domain and determines or registers the frequency domain profiles of the signals. The maximum responses of the signals can be held for a period of time to determine the frequency domain profiles of the signals. The spectrum analyzer then performs signal discrimination based on the frequency domain profiles of the signals to determine whether a partial discharge signal is present. For instance, statistical features associated with the frequency domain profiles can be used to discriminate or distinguish the partial discharge signal from a switching noise signal and/or other background or environmental signals.

In some instances, the spectrum analyzer can also be configured to switch modes from the 2D frequency domain to a 3D domain so that the frequency of occurrence of the signals can be considered. This may allow for detection of partial discharge signals that are sporadic and/or hidden in the PWM switching noise. Such detection may be realized, at least in part, through real-time spectrum analysis, e.g., using a seamless Fast Fourier Transform (FFT). In a further aspect, a physics-based signal discrimination approach can also be used for signal discrimination, for example utilizing pressure-dependency of the frequency contents in a partial discharge signal.

The systems and methods provided herein advantageously provide effective and reliable online partial discharge detection. Such systems and methods are not subject to the drawbacks of conventional detection systems, such as filter and signal trigger-based detection systems. Detected partial discharge signals using the systems and methods provided herein can be utilized for online health monitoring and diagnosis of insulation systems associated with the electric components of electrical drive systems. The accuracy and reliability of the partial discharge signal detection provided by the systems and methods provided herein can improve health estimates. Online health monitoring and diagnosis of an insulation system can provide critical information for machine/drive system replacement and repair decisions and also allows for proactive action without interrupting the operation of the system, among other benefits.

FIG. 1 provides a schematic top plan view of an aircraft 100 according to an example embodiment of the present disclosure. As shown, for this embodiment, the aircraft 100 of FIG. 1 is a fixed-wing aircraft having a "tube and wing" configuration. However, the inventive aspects of the present disclosure may apply to other aircraft configurations as well. Further, the inventive aspects of the present disclosure apply to both manned and unmanned aircraft, or Unmanned Aerial Vehicles (UAVs). For reference, the aircraft 100 defines a longitudinal direction L1 and a lateral direction L2 extending perpendicular to the longitudinal direction L1. The aircraft 100 also defines a lateral centerline LC. The aircraft 100 extends between a first end 110 and a second end 112, e.g., along the longitudinal direction L1. The first end 110 is a forward end of the aircraft 100 and the second end 112 is a rear or aft end of the aircraft 100 for this embodiment. The lateral centerline LC separates the aircraft 100 into halves along the lateral direction L2, or stated another way, into a first side 114 and a second side 116.

The aircraft 100 includes a fuselage 118 having a starboard side 120 and a port side 122. The aircraft 100 also includes a pair of wings 130, 140 each extending laterally outward from the fuselage 118. Particularly, a first wing 130 extends outward from the starboard side 120 of the fuselage 118, e.g., along the lateral direction L2. The first wing 130 spans between a wing root 132 and a wing tip 134. A spanwise length of the first wing 130 extends between the wing root 132 and the wing tip 134. The first wing 130 also has a leading edge 136 and a trailing edge 138. A chordwise length of the first wing 130 extends between the leading edge 136 and the trailing edge 138.

A second wing 140 extends outward from the port side 122 of the fuselage 118 opposite the first wing 130. The second wing 140 spans between a wing root 142 and a wing tip 144. A spanwise length of the second wing 140 extends between the wing root 142 and the wing tip 144. The second wing 140 also has a leading edge 146 and a trailing edge 148. A chordwise length of the second wing 140 extends between the leading edge 146 and the trailing edge 148. The aircraft 100 can also include various control surfaces for controlling the aircraft during flight. Example control surfaces include elevators, rudders, ailerons, spoilers, flaps, slats, air brakes, or trim devices, etc. Various actuators, servo motors, and other devices may be used to manipulate the various control surfaces and variable geometry components of the aircraft 100.

The aircraft 100 further includes a propulsion system 150. The propulsion system 150 is operable to produce thrust for the aircraft 100. As depicted, the propulsion system 150 includes a plurality of propulsors or fans. The fans are unducted in this example embodiment. The fans can be any suitable type of fan or propulsor, including, without limitation, propellers, open rotor fans, etc. In other embodiments, the fans can be ducted, fully or partially. For this embodiment, the propulsion system 150 includes a first set 160 of one or more fans mounted to the first wing 130 as well as a second set 170 of one or more fans distributed along and mounted to the second wing 140. Specifically, for this embodiment, the first set 160 includes a plurality of fans 162A, 162B, 162C distributed spanwise along the first wing 130 and the second set 170 includes a plurality of fans 172A, 172B, 172C distributed spanwise along the second wing 140. The fans 162A, 162B, 162C of the first set 160 each include a plurality of fan blades 164A, 164B, 164C rotatable about their respective axes of rotation and the fans 172A, 172B, 172C of the second set 170 each include a plurality of fan blades 174A, 174B, 174C rotatable about their respective axes of rotation.

While the first set 160 and the second set 170 of fans are shown having three unducted fans each, it will be appreciated that in other embodiments that the aircraft 100 can have more or less than three unducted fans mounted to and distributed along its wings 130, 140. Moreover, the aircraft 100 can additionally or alternatively have fans or propulsors located in other suitable locations, such as to the aft end of the fuselage 118.

As further depicted in FIG. 1, the propulsion system 150 includes at least one electric machine for driving the fan blades 164A, 164B, 164C of the fans 162A, 162B, 162C of the first set 160 and the fan blades 174A, 174B, 174C of the fans 172A, 172B, 172C of the second set 170. In some embodiments, the propulsion system 150 can include a single electric machine for driving the fan blades 164A, 164B, 164C of the fans 162A, 162B, 162C of the first set 160 and the fan blades 174A, 174B, 174C of the fans 172A, 172B, 172C of the second set 170. The electric machine can be operable to drive the fans 162A, 162B, 162C, 172A, 172B, 172C, for example. In some other embodiments, the propulsion system 150 can include a first electric machine for driving the fan blades 164A, 164B, 164C of the fans 162A, 162B, 162C of the first set 160 and a second electric machine for driving the fan blades 174A, 174B, 174C of the fans 172A, 172B, 172C of the second set 170. The first and second electric machines can both be operable to drive the fans 162A, 162B, 162C, 172A, 172B, 172C.

For this embodiment, the fans 162A, 162B, 162C of the first set 160 and the fans 172A, 172B, 172C of the second set 170 each have a dedicated electric machine operatively coupled thereto. Specifically, the fans 162A, 162B, 162C of the first set 160 each have an associated electric machine 166A, 166B, 166C and the fans 172A, 172B, 172C of the second set 170 each have an associated electric machine 176A, 176B, 176C. The electric machines 166A, 166B, 166C are operable to drive the fan blades 164A, 164B, 164C of their respective fans 162A, 162B, 162C and the electric machines 176A, 176B, 176C are operable to drive the fan blades 174A, 174B, 174C of their respective fans 172A, 172B, 172C. The electric machines can be electric motors, electric generators, or combination motor/generators, for example. The propulsion system 150 can have other suitable configurations and number of electric machines in other example embodiments.

Moreover, for this embodiment, the propulsion system 150 of the aircraft 100 is an electric propulsion system and includes one or more electrical power sources, power electronics, transmission lines, etc. for providing electrical power to or carrying electrical power from the electric machines 166A, 166B, 166C, 176A, 176B, 176C. For instance, as shown in FIG. 1, the aircraft 100 includes an electrical power source 180. The electrical power source 180 can be one or more energy storage devices, for example. The one or more energy storage devices can include one or more batteries, battery packs, super capacitors, etc. The electrical power source 180 can be mounted within the fuselage 118 or in another suitable location. Electrical power can be transmitted from the electrical power source 180 to various electrical power-consuming loads, such as the electric machines 166A, 166B, 166C, 176A, 176B, 176C. A power bus 182 can carry the electrical power from the electrical power source 180 to the power-consuming loads. The power bus 182 can include one or more transmission lines or cables, switches, as well as other electrical components.

A plurality of power electronics can be positioned along the power bus 182. For instance, for this embodiment, a first power converter 184 can be positioned along the power bus 182. The first power converter 184 can be a DC-DC power converter operable to change a voltage of the electrical power provided by the electrical power source 180. The electrical power conditioned by the first power converter 184 can be provided as Direct Current (DC) along the power bus 182 to a plurality of electric drives or power conversion devices, such as inverters. For this embodiment, each electric machine 166A, 166B, 166C, 176A, 176B, 176C has an associated power conversion device 168A, 168B, 168C, 178A, 178B, 178C. The power conversion devices 168A, 168B, 168C, 178A, 178B, 178C can convert the incoming DC current to Alternating Current (AC). Accordingly, the power conversion devices 168A, 168B, 168C, 178A, 178B, 178C can be DC-AC inverters. The AC current can be provided to the electric machines 166A, 166B, 166C, 176A, 176B, 176C. It will be appreciated that the configuration of the electric distributed unducted fan propulsion system provided in FIG. 1 is provided by way of example and is not intended to be limiting. Other suitable configurations for providing electrical power to the electric machines 166A, 166B, 166C, 176A, 176B, 176C are possible.

In some embodiments, the propulsion system 150 of the aircraft 100 can be a hybrid electric distributed unducted fan propulsion system. In such embodiments, for example, the propulsion system 150 can include a mechanical power source, such as a gas turbine engine 186. The gas turbine engine 186 can be operatively coupled with an electric machine 188. The electric machine 188 is operable to generate electrical power. In this manner, the electric machine 188 can output electrical power. The electrical power output by the electric machine 188 can be provided to the electrical power source 180 and/or to the electric machines 166A, 166B, 166C, 176A, 176B, 176C for driving their respective fans 162A, 162B, 162C, 172A, 172B, 172C.

The electric machines 166A, 166B, 166C, 176A, 176B, 176C, their respective fans 162A, 162B, 162C, 172A, 172B, 172C, and their respective electric drives or power conversion devices 168A, 168B, 168C, 178A, 178B, 178C can each form individual electrical drive systems and can collectively form an electrical drive system for the propulsion system 150. As will be provided below, the inventive systems and methods provided herein provide for online partial discharge detection associated with components of electrical drive systems, such as any of the electrical drive systems of the propulsion system 150 of the aircraft of FIG. 1. It will be appreciated, however, that the inventive aspects of the present disclosure are not limited to aviation or aerospace applications. Rather, the inventive aspects are applicable to a wide range of applications and industries, including, without limitation, HVAC/HVDC power transmission and power conversion, healthcare, renewables, and transportation applications.

Figure 2:
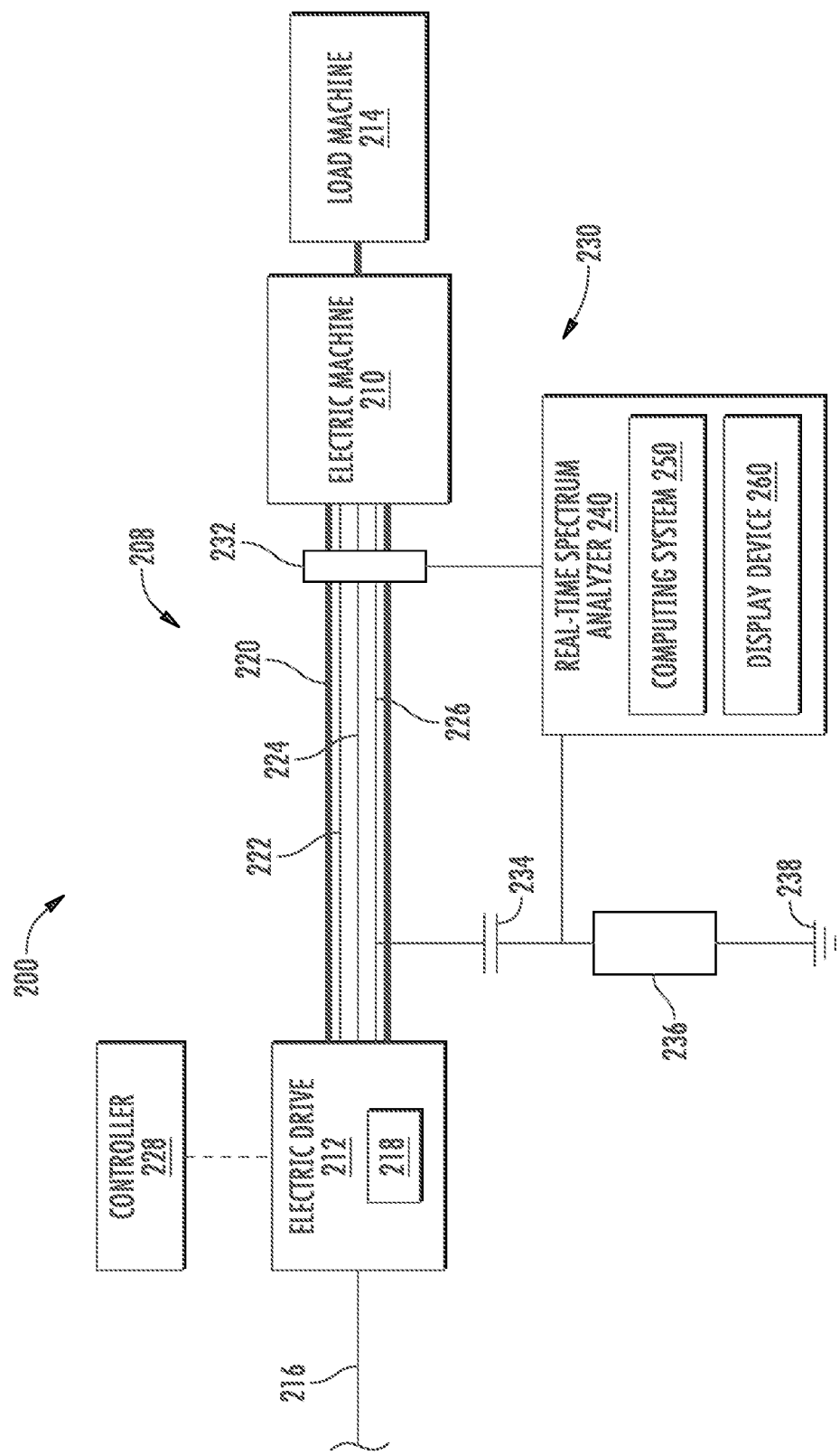
FIG. 2 provides a schematic block diagram of an example system that includes an electrical drive system and a data acquisition system according to one example embodiment of the present disclosure.

FIG. 2 provides a schematic block diagram of an example system 200 that includes an electrical drive system 208 according to one example embodiment of the present disclosure. For instance, the electrical drive system 208 can be one of the electrical drive systems of the propulsion system 150 of the aircraft of FIG. 1, for example. As shown in FIG. 2, the electrical drive system 208 includes an electric machine 210 and an electric drive 212 electrically coupled with the electric machine 210. A load machine 214 or device is operatively coupled with the electric machine 210. The electric machine 210 can be an electric motor, an electric generator, or a combination motor/generator operable in a drive mode and in a generator mode. In a drive mode, the electric machine 210 drives the load machine 214. In a generator mode, the electric machine 210 generates electrical power based on the torque provided by the load machine 214. As one example, the load machine 214 can be a propulsor or fan operable to produce thrust for a vehicle, such as an aircraft. The electric drive 212 of the power electronics of the electrical drive system 208 is operable to control and/or convert electrical power provided to or received from the electric machine 210. Electrical power can be provided to or carried away from the electric drive 212 via a power bus 216. The electric drive 212 can include one or more switching components 218, such as wide bandgap electronics, such as wide bandgap semiconductors. As one example, the one or more switching components 218 can include one or more SiC MOSFETs. In this regard, the electrical drive system 208 can be a wide bandgap-based electrical drive system.

As another example, the switching components 218 can include one or more diodes. For instance, in some embodiments, the electrical drive system 208 can include a generator (not shown), such as a Permanent Magnet Generator (PMG). The generator can include a middle exciter stage having a rectifier. The rectifier can include one or more switching components 218, which can be diodes, for example. The switching components 218 of the rectifier can convert AC to DC power for main rotor excitation.

A controller 228 is communicatively coupled with the electric drive 212, e.g., for controlling the switching components 218. The controller 228 can have one or more non-transitory memory devices and one or more processors, such as a microcontroller. The controller 228 can receive feedback from the electric drive 212, e.g., current and/or voltage readings, the electric machine 210, e.g., temperature readings, and/or the load machine 214, e.g., speed, position, and/or torque readings. The controller 228 can control the electric drive 212 based at least in part on the feedback received.

For this embodiment, the electric machine 210 is electrically coupled with the electric drive 212 by a multiphase cable 220. The multiphase cable 220 includes a first cable 222 associated with a first phase, a second cable 224 associated with a second phase, and a third cable 226 associated with a third phase. In this regard, the multiphase cable 220 is a three-phase cable and the electric machine 210 is a three-phase machine. However, it will be appreciated that the electrical drive system 208 depicted in FIG. 2 can have any multiphase configuration, such as a six-phase configuration. In yet other embodiments, the electric drive 212 and the electric machine 210 are integrated.

As further shown in FIG. 2, the system 200 includes a data acquisition system 230. The data acquisition system 230 includes a sensing device 232 operable to sense signals transmitted between the electric machine 210 and the electric drive 212 or elsewhere along the electrical system. The signals can include general background noises and noises associated with drive switching, or Pulse Width Modulation (PWM) switching noise generated by switching devices of the electric drive 212. In addition, the signals captured by the sensing device 232 can include partial discharge signals. In some embodiments, the sensing device 232 samples or captures the signals using a Nyquist sampling rule in which signals are sampled at a rate that is at least two times the highest signal frequency of interest.

Moreover, for this embodiment, the sensing device 232 is a Radio Frequency Current Transformer (RFCT). As shown, the sensing device 232, or RFCT, is clamped to the first cable 222, the second cable 224, and the third cable 226 of the multiphase cable. The sensing device 232, or RFCT, can also be clamped to grounding leads of the first cable 222, the second cable 224, and the third cable 226 as well, in the event such grounding leads exist. In other embodiments, the sensing device 232 can be a High Frequency Current Transformer (HFCT). In alternative embodiments, the sensing device 232 can be an Ultra High Frequency (UHF) electromagnetic antenna. The UHF electromagnetic antenna can be positioned within 1-2 inches (2.5-5 cm) of the desired test subjects, such as the multiphase cable 220. In yet other embodiments, the sensing device 232 can be a capacitive coupler directly connected to the live part of the system 200. It will be appreciated that the sensing device 232 can be positioned in other suitable locations as well.

In addition, as depicted in FIG. 2, the data acquisition system 230 includes a spectrum analyzer 240. The spectrum analyzer 240 can be a real-time spectrum analyzer, for example. The spectrum analyzer 240 is communicatively coupled with the sensing device 232, e.g., via one or more wired and/or wireless communication links. The spectrum analyzer 240 includes a display device 260 operable to display various information, such as real-time captured signals. The spectrum analyzer 240 also includes a computing system 250 having one or more memory devices and one or more processors. As will be explained further herein, the computing system 250 of the spectrum analyzer 240 can receive signals captured by the sensing device 232 and can analyze the received signals to detect partial discharge signals associated with the electrical drive system 208. Particularly, the computing system 250 of the spectrum analyzer 240 can discriminate between partial discharge signals and PWM switching noise generated by the electric drive 212 based at least in part on a statistical profile of their frequency spectrum. In addition, in some embodiments, physics-based signal discrimination can also be applied, e.g., to confirm the presence of partial discharge signals. As one example, as will be explained further herein, physics-based signal discrimination can be based on the pressure-dependency of the partial discharge signal. The spectrum analyzer 240 can be used to detect signals associated with partial discharge online, e.g., onboard an aircraft or other structure to which the components of the electrical drive system 208 are mounted, or offline, e.g., in a testing laboratory.

As further shown in FIG. 2, a capacitive coupler 234 is electrically coupled with a live part of the system 200. For this embodiment, the multiphase cable 220, and particularly the third cable 226, is electrically coupled with the capacitive coupler 234. In other embodiments, the capacitive coupler 234 can be electrically coupled with a live part of the system 200 at another suitable location, particularly when the multiphase cable 220 is insulated. The capacitive coupler 234 is electrically coupled with a partial discharge coupler 236. The partial discharge coupler 236 can be electrically coupled with a grounding system 238 as depicted in FIG. 2. As one example, the grounding system 238 can be an aircraft grounding system. The capacitive coupler 234 and the partial discharge coupler 236 can form a sensing circuit along with the sensing device 232. For instance, these elements can form an RLC impedance network. The output across the RLC network can be a voltage pulse that has a magnitude proportional to the PD magnitude.

With reference still to FIG. 2, an example manner in which the spectrum analyzer 240 can detect and/or distinguish partial discharge signals from switching noise provided in a PWM modulated signal will now be provided.

To perform an online or offline partial discharge signal test, electrical power is provided from an electrical power source, e.g., a battery or line voltage, to the electric drive 212 via the power bus 216. To control the electrical power provided to the electric machine 210, the electric drive 212 performs various switching operations. Particularly, the switching components 218 of the electric drive 212 can rapidly switch on and off to control the electrical power provided to the electric machine 210. In this manner, the signals provided by the electric drive 212 can include a signal in a PWM waveform. The switching operations performed by the electric drive 212 can effectively vary the torque and/or speed of the electric machine 210. The switching operations can be performed by wide bandgap electronics, such as SiC MOSFETs, for example. Signals are transmitted from the electric drive 212 to the electric machine 210 through the multiphase cable 220.

The sensing device 232 captures the signals. As noted above, the signals can include various components or component signals. For instance, the signals can include general background or environmental noises, noises associated with drive switching, or noise generated by the switching components 218 rapidly switching to generate a PWM signal, and in some instances, the signals can include a partial discharge signal. For this embodiment, the signals captured by the sensing device 232 are directly input into the spectrum analyzer 240. In this regard, for this embodiment, no filter is needed nor is voltage sensing or signal triggering needed. Accordingly, the system of the present disclosure is not subject to the drawbacks associated with passing sensor signals through filters.

Upon receiving the signals, the computing system 250 of the spectrum analyzer 240 transforms the signals into the frequency domain. As one example, the computing system 250 can transform the signals into the frequency domain by applying an FFT to the signals. Particularly, the computing system 250 can perform a sweep to calculate FFT buckets for the frequency range or band of interest in real time. The FFT buckets can be seamless or overlapped so that no sporadic signals are missed. Applying the FFT to the signals can transform the signals from a time domain into the frequency domain. That is, the one or more processors of the computing system 250 can transform the received signals from time-domain signals into frequency-domain signals. In some embodiments, the computing system 250 of the spectrum analyzer 240 can perform multiple sweeps. In some instances, performing one or more sweeps on the received signals can catch none or only a small portion of a narrow band signal of interest. Transformation of the signals into the frequency domain is performed in real time.

With the signals transformed into the frequency domain, the computing system 250 of the spectrum analyzer 240 can execute a "MAX HOLD" or maximum hold function to maintain maximum responses of one or more of the signals in the frequency domain over a time period. The time period can be selected so as to allow the maximum responses of the signals in the frequency domain to stabilize within a predetermined margin in shape and amplitude.

The computing system 250 of the spectrum analyzer 240 is also configured to determine, using the signals transformed into the frequency domain, a frequency domain profile for the signals. The frequency domain profile of the signals are determined based at least in part on the maximum responses of the signals maintained over the period of time.

Figure 3:
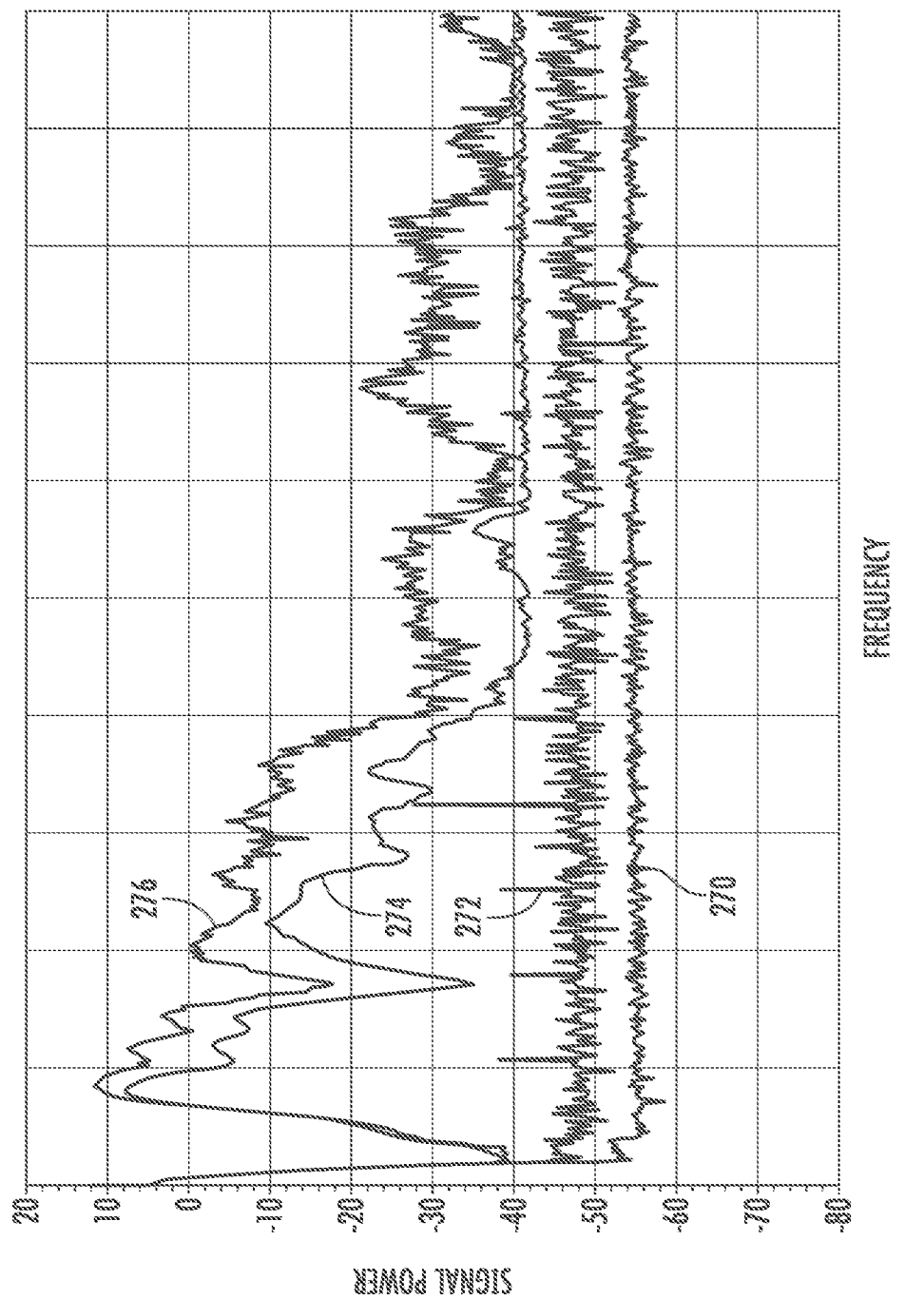
FIG. 3 provides a graph depicting the signal power of various signals transformed into the frequency domain according to an example aspect of the present disclosure.

By way of example, FIG. 3 provides a graph depicting the signal power or amplitude of received signals transformed into the frequency domain. Particularly, FIG. 3 depicts the received signals, which include instantaneous signals 270, 272 not subject to the maximum hold function as well as a first signal 274 and a second signal 276 with a maximum hold function applied thereto. Maintaining the maximum responses of the first and second signals 274, 276 over time facilitates seamless registration of the frequency characteristics of the first and second signals 274, 276. Accordingly, the frequency domain profile of the first signal 274 and the second signal 276 can be constructed as shown in FIG. 3.

Further, with reference to FIGS. 2 and 3, the computing system 250 of the spectrum analyzer 240 can detect a partial discharge signal included within the signals by discriminating between the switching noise signal (e.g., the first signal 274) and at least one other signal included within the signals (e.g., the second signal 276) based at least in part on the frequency domain profile of the switching noise signal and the frequency domain profile of the at least one other signal. The at least one other signal can be a signal suspected of being a partial discharge signal, e.g., based on its frequency domain profile. In this regard, the at least one other signal can be a signal of interest. As one example, the computing system 250 can discriminate between a switching noise signal and the at least one other signal based at least in part on one or more statistical features associated with the frequency domain profile of the switching noise signal and the frequency domain profile of the at least one other signal. The one or more statistical features can be any suitable statistical features that provide for a quantitative characterization of the frequency domain profiles associated with the received signals. Example statistical features can include, without limitation, a mean, variance, skewness, kurtosis, higher order features, a combination thereof, etc. associated with a given profile.

In some embodiments, to discriminate or distinguish a partial discharge signal from a signal associated with PWM switching noise, the computing system 250 of the spectrum analyzer 240 can classify the signals using the one or more determined statistical features associated with the signals. In such embodiments, for example, at least one of the signals 274, 276 can be classified as the switching noise signal and one of the signals can be classified as the partial discharge signal. As depicted in FIG. 3, based on the statistical features of the signals, the signals can be classified. Particularly, the first signal 274 can be classified as the switching noise signal and the second signal 276 can be classified as the partial discharge signal. As shown, the frequency characteristics of the second signal 276 are quite different from the switching noise signal, or first signal 274. The curve of the second signal 276 has distinguishing features. For instance, the envelop of the curve of the second signal 276 is beyond the noise maximum response profile, which indicates that the second signal 276 is likely a partial discharge signal, thereby indicating the presence of partial discharge. In other words, the curve of the second signal 276 is a frequency domain maximum hold response associated with partial discharge. For the frequency domain spectrum shown in FIG. 3, the second signal 276 or partial discharge signal held at the maximum hold grows on top of the first signal 274 or switching noise signal. Sometimes, however, the low frequency end response of the second signal 276 (the response associated with partial discharge) could totally or significantly overlap with the first signal 274 (the noise response). In other instances, the partial discharge response may only differ from the noise response in a narrow band. In this way, in other frequency domains, the max-hold frequency profile of the partial discharge response may appear similar to the profile of the noise response signal.

As noted, the switching noise generated by the switching components 218 may overlap significantly with the detection frequency band for detecting signals associated with partial discharge. Nevertheless, as depicted in FIG. 3, it will be appreciated that transforming the signals into the frequency domain, registering their profiles while applying the maximum hold function thereto, and considering the statistical features of the frequency domain profiles of the signals can make the partial discharge signal, or second signal 276 in this example, stand out relative to the noise signal associated with PWM switching. In this regard, sporadic partial discharge signals can be captured and false positive detection is avoided or greatly reduced. The partial discharge approach provided herein also provides opportunity to discriminate signals in 2D, and in some instances as will be explained further below, in 3D. The detected partial discharge signals can be utilized for various purposes, such as for determining the health of the insulation system of the electrical drive system 208 and/or diagnosing certain areas of the insulation system in need of repair or replacement.

Figure 4:
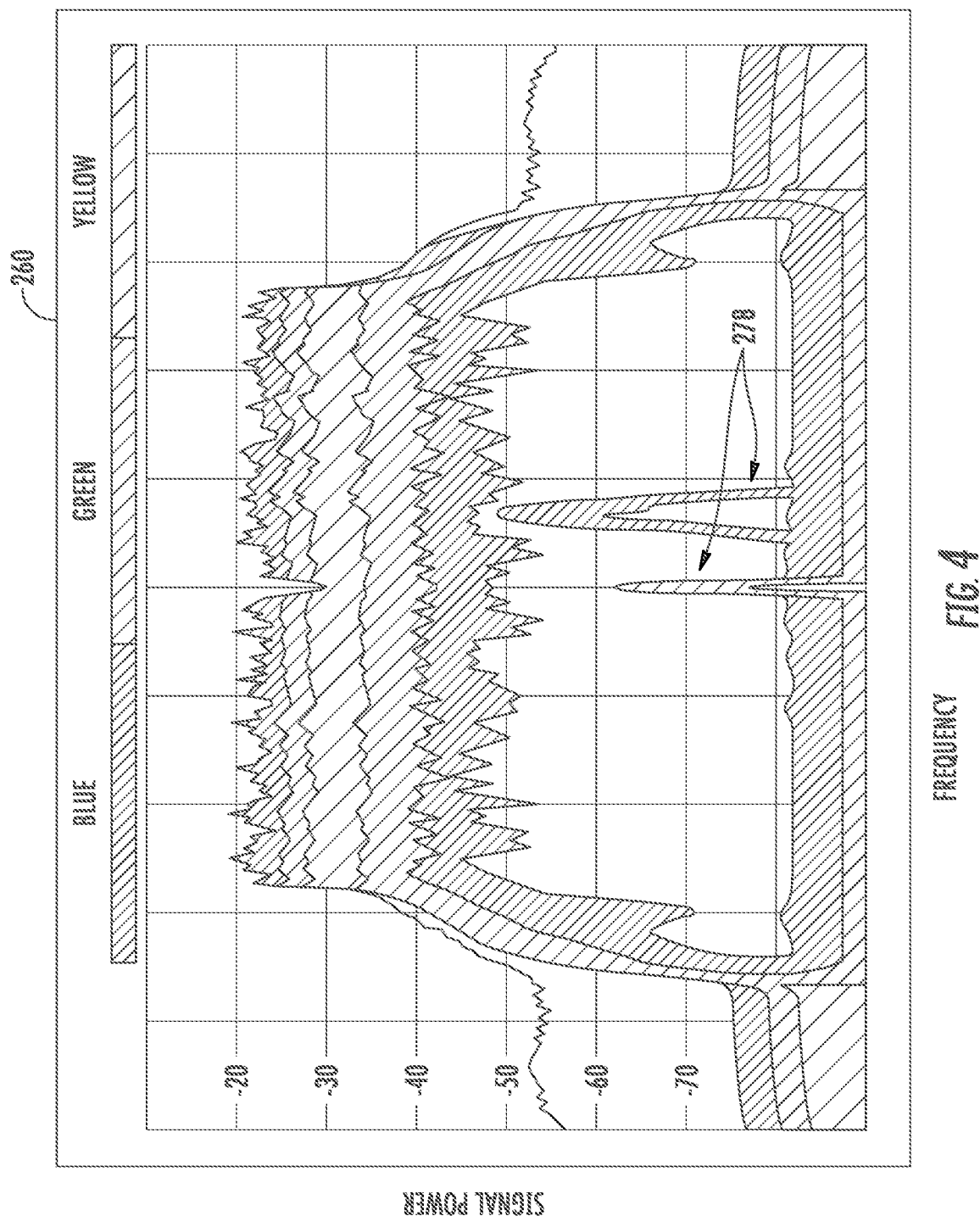
FIG. 4 provides a real-time spectrogram displayed on a display device of the data acquisition system of FIG. 2.

In some instances, the real-time spectrum analyzer 240 can be utilized to detect sporadic signals (like partial discharge under DC voltage) as well as partial discharge signals that have a signal frequency band that is narrow and a power level that is low in comparison to switching noise signal spectrum. In such instances, the frequency spectrum is totally "hidden" in the presence of PWM switching noise. Accordingly, in some embodiments, the spectrum analyzer 240 can implement a persistence spectrum analysis in which all signals are superimposed in a single diagram, e.g., on a display device. For instance, as shown in FIG. 4, all signals are shown superimposed in a single diagram on the display device 260 of the spectrum analyzer 240 (FIG. 2). As depicted in FIG. 4, a color coding of a trace of the signals shows how often signals occur at a specific frequency (i.e., a frequency of occurrence) and power level. In this regard, the persistence spectrum helps to detect "hidden" signals, such as hidden signals 278. In this example, the hidden signals 278 are partial discharge signals. As depicted, the hidden signals 278, or partial discharge signals in this example, are "hidden" below the PWM signals and switching noise yet they are detectable by the persistence spectrum analysis tool of the spectrum analyzer 240.

Accordingly, in some embodiments, the computing system 250 of the spectrum analyzer 240 can discriminate between the switching noise signal and other signals based at least in part on a signal occurrence rate associated with the switching noise signal and the frequency domain profile of the other component signals included within the signals. For instance, a mode of the spectrum analyzer 240 can be switched to a 3D mode so that the frequency of occurrence of the signals can be presented on the display device 260. This allows for detection of hidden and/or sporadic signals.

In accordance with a further inventive aspect of the present disclosure, a physics-based signal discrimination approach can be utilized to detect partial discharge signals and/or confirm that the partial discharge signals detected are in fact actual partial discharge signals. The physics-based signal discrimination approach provided herein leverages the pressure-dependency of a partial discharge signal or effect that altitude/pressure has on a partial discharge signal for detecting and/or confirming partial discharge signals. As will be appreciated, partial discharge can have different Partial Discharge Inception Voltages (PDIV) at different altitudes/pressures. For example, at sea level, there could be no partial discharge signal at 900V rms, but at a high altitude, such as 38,000 ft, and at the same voltage excitation, there could be partial discharge. In general, the PDIV of an insulation system of an electrical drive system reduces at low pressure/high altitude.

With reference now to FIG. 2, an example manner in which a physics-based approach can be used to detect and/or confirm partial discharge signals will be provided. For this example embodiment, the spectrum analyzer 240 receives first signals from the sensing device 232. The first signals are provided to the electric machine 210 of the electrical drive system 208 and are captured by the sensing device 232. The first signals can include various components or component signals. For instance, the first signals can include a first switching noise signal generated by the electric drive 212 of the electrical drive system 208, or more particularly the switching components 218 thereof. Notably, the first signals are sensed by the sensing device 232 when the electrical drive system 208 is at a first altitude, e.g., 35,000 ft. The pressure of the air at the first altitude can have a first pressure value. The first signals can include other component signals, such as, in some instances, a partial discharge signal.

A partial discharge signal can be detected from the first signals, e.g., in an example manner described above. Particularly, the computing system 250 of the spectrum analyzer 240 can detect a first partial discharge signal included within the first signals by discriminating between the first switching noise signal and one or more of the other component signals of the first signals based at least in part on a frequency domain profile associated with the first switching noise signal and a frequency domain profile associated with the other component signal being compared thereto. For instance, the spectrum analyzer 240 can discriminate between the first signals using one or more statistical features of their respective frequency domain profiles or spectrums.

In addition, the spectrum analyzer 240 receives second signals from the sensing device 232. The second signals are provided to the electric machine 210 of the electrical drive system 208 and are sensed by the sensing device 232. The second signals include various components or component signals. For instance, the second signals can include a second switching noise signal generated by the electric drive 212 of the electrical drive system 208. Notably, the second signals are sensed when the electrical drive system 208 is at a second altitude, e.g., 38,000 ft. The second altitude is different than the first altitude. The pressure of the air at the first altitude can have a second pressure value, which is less than the first pressure value. The second signals can include other component signals, such as, in some instances, a partial discharge signal.

A partial discharge signal can be detected from the second signals, e.g., in an example manner described herein. Particularly, the computing system 250 of the spectrum analyzer 240 can detect a second partial discharge signal included within the second signals by discriminating between the second switching noise signal and one or more other component signals based at least in part on a frequency domain profile associated with the second switching noise signal and a frequency domain profile associated with the other component signals included within the second signals. For instance, the spectrum analyzer 240 can discriminate between the second signals using one or more statistical features of their respective frequency domain profiles or spectrums.

The computing system 250 of the spectrum analyzer 240 can confirm the presence of partial discharge by comparing one or more statistical features associated with a frequency domain profile of the first signals captured at the first altitude or first pressure condition and one or more statistical features associated with a frequency domain profile of the second signals captured at the second altitude or second pressure condition. In this way, it can be determined or confirmed that one or both of the suspected partial discharge signals are in fact partial discharge signals. In this regard, the spectrum analyzer 240 can analyze suspected partial discharge signals captured at the two different altitudes/pressures to make such a determination. In some example embodiments, the spectrum analyzer 240 can determine whether at least one of the first partial discharge signal and the second partial discharge signal are actual partial discharge signals based at least in part on one or more statistical features associated with the frequency domain profile of the first signals and one or more statistical features associated with the frequency domain profile of the second signals.

Figure 5:
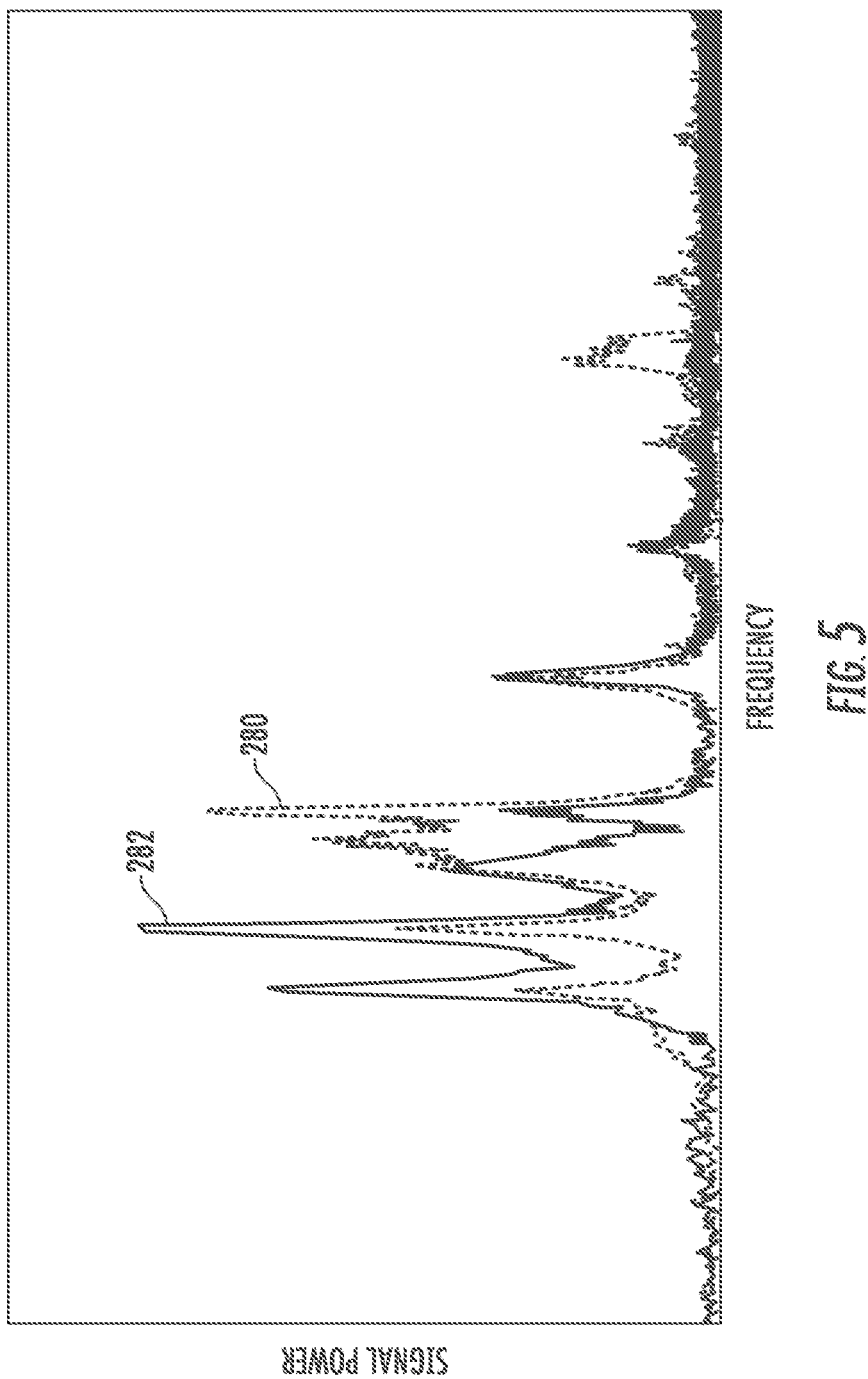
FIG. 5 provides a graph depicting the signal power of various signals captured at different altitudes transformed into the frequency domain according to an example aspect of the present disclosure.

For instance, with reference now to FIGS. 2 and 5, FIG. 5 provides a graph depicting the signal power of various signals transformed into the frequency domain according to an example aspect of the present disclosure. Particularly, a frequency domain profile of a first signal 280 captured at a first altitude and a frequency domain profile of a second signal 282 captured at a second altitude (e.g., at high altitude corresponding to a low pressure condition) for a same voltage level are shown in FIG. 5. In this example, the first altitude is a low altitude (e.g., sea level) corresponding to a high pressure condition and the second altitude is a high altitude (e.g., 35,000 ft above sea level) corresponding to a low pressure condition. Further, for this example, the first and second signals 280, 282 are both suspected of having features associated with partial discharge, or stated differently, the signals 280, 282 are both suspected of containing partial discharge signals. Moreover, in FIG. 5, the signals 280, 282 are depicted with switching noise and other noise removed for the sake of more clearly illustrating the suspected partial discharge components of the signals 280, 282.

As shown, the frequency domain profile of the first signal 280 is overlaid with the frequency domain profile of the second signal 282 in a frequency domain spectrum by the computing system 250 of the spectrum analyzer 240. The computing system 250 can compare the frequency domain profile of the first signal 280 overlaid with the frequency domain profile of the second signal 282 in the frequency domain spectrum. Based on the comparison, the computing system 250 can determine whether partial discharge is present in the system, or rather, whether at least one of the first suspected partial discharge signal included within the first signal 280 and the second suspected partial discharge signal included within the second signal 282 are actual partial discharge signals.

In some embodiments, as noted above, the computing system 250 can determine whether at least one of the signals 280, 282 is an actual partial discharge signal based at least in part on a comparison between one or more statistical features associated with the frequency domain profile of the first signal 280 and one or more statistical features associated with the frequency domain profile of the second signal 282. Accordingly, the computing system 250 can determine the statistical features of the frequency domain profiles of the first signal 280 and second signal 282 and can compare them both to expected trends and also to determine their frequency characteristic differences.

Particularly, in comparing the statistical features of the first and second signals 280, 282, the computing system 250 can compare an amplitude of the signal power of the first signal 280 to an amplitude of the signal power of the second signal 282 at various frequencies, e.g., over the whole frequency spectrum or over preselected frequency bands. The computing system 250 can also compare a frequency distribution of the first signal 280 to a frequency distribution of the second signal 282 over a range of frequencies, e.g., over the whole frequency spectrum or over preselected frequency bands. Differences in the amplitude and frequency distribution can indicate whether the first and second signals 280, 282 include partial discharge signals or features. In this example, the first and second signals 280, 280 have significant differences in their amplitudes at certain frequencies and their distributions trends indicate that both the first and second signals 280, 282 have partial discharge signals. As the frequency domain profiles or signatures of the first and second signals 280, 282 have significant differences and trend relative to their respective expected frequency domain signatures associated with partial discharge, there is a degree of confidence that they are both in fact partial discharge signals. The degree of confidence can be output by the system based on the statistical closeness of the frequency domain profiles relative to expected profiles and/or relative to one another. Overall, if the frequency domain profile of the first signal 280 and the frequency domain profile of the second signal 282 are significantly different due to pressure change, this is an indication that at least one of the signals 280, 282 contains a partial discharge signal.

Generally, partial discharge signals captured at high altitude/low pressure conditions have narrower frequency distributions and their high frequency contents attenuate while their low frequency contents become stronger in signal power amplitude compared to signals at low altitude/high pressure conditions. If the amplitudes of the first and second signals 280, 282 trended more closely to one another and/or if there was minimal differences in their respective frequency distributions, this may indicate that one or both of the signals 280, 282 is/are absent partial discharge features.

In other scenarios, only one of the signals 280, 282 may indicate partial discharge features. For instance, the second signal 282 captured at high altitude/low pressure (e.g., at 35,000 ft above sea level) may include partial discharge signals while the first signal 280 captured at low altitude/high pressure (e.g., at sea level) may not include partial discharge signals. In comparing the statistical features of the first and second signals 280, 282, the computing system 250 can determine that, for the same voltage level, the second signal 282 has features indicating partial discharge while the first signal 280 only contains noise, or rather, does not include features indicating partial discharge. The missing first signal 280 would indicate that the first signal 280 does not include partial discharge features while the second signals 282 does include partial discharge features.

With reference to FIG. 2, another example manner in which a physics-based approach can be used to detect and/or confirm partial discharge signals will be provided. For this example embodiment, the computing system 250 of the spectrum analyzer 240 is configured to detect a first partial discharge signal included within first signals sensed by the sensing device 232 at a first time and at a first altitude or within a first altitude range, e.g., within 100 ft of 40,000 ft. The first signals are provided to the electric machine 210 and are sensed by the sensing device 232. The first signals include a first switching noise signal generated by the one or more switching components 218. The first partial discharge signal can be detected using any of the example manners noted herein.

In addition, the computing system 250 of the spectrum analyzer 240 is configured to detect a second partial discharge signal included within second signals sensed by the sensing device 232 at a second time and at the first altitude or within the first altitude range. The second time is later in time than the first time. In this regard, the first and second signals are captured at the same or roughly the same altitude but at different times. For instance, the electrical drive system 208 can be embodied on an aircraft and the first time can be associated with a time in which the aircraft is generally ascending (e.g., during a climb phase of flight), and the second time can be associated with a time in which the aircraft is generally descending (e.g., during a descent phase of flight). The second signals are provided to the electric machine 210 and are sensed by the sensing device 232. The second signals include a second switching noise signal generated by the one or more switching components 218.

Further, the computing system 250 of the spectrum analyzer 240 is configured to determine whether at least one of the first partial discharge signal and the second partial discharge signal are actual partial discharge signals based at least in part on a comparison of one or more statistical features associated with a frequency domain profile of the first signals and a frequency domain profile of the second signals. For instance, a similar analysis noted above with respect to the embodiment in which the signals are sensed at different altitudes can be utilized to determine whether partial discharge is present. For instance, the characteristics or statistical features of the frequency domain profile associated with the first signal can be compared with the characteristics or statistical features of the frequency domain profile associated with the second signal. As noted above, the confirmed presence of partial discharge can be utilized for various purposes, such as for determining the health of the insulation system of the electrical drive system and/or diagnosing certain areas of the insulation system in need of repair or replacement.

Figure 6:
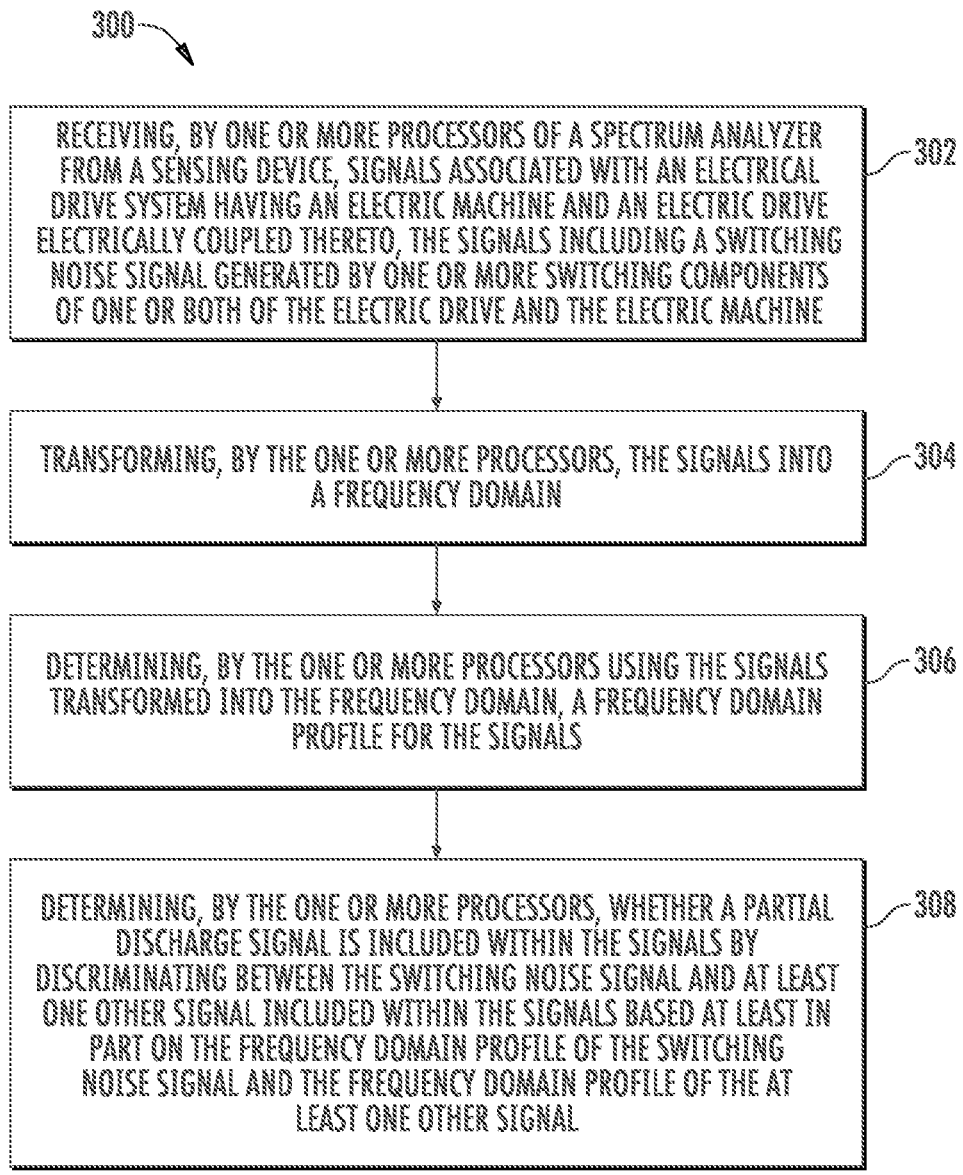
FIG. 6 provides a flow diagram for a method of detecting partial discharge signals in accordance with an exemplary aspect of the present disclosure.

FIG. 6 provides a flow diagram for a method (300) of detecting partial discharge signals associated with an electrical drive system in accordance with an exemplary aspect of the present disclosure. In certain exemplary aspects, the method (300) may utilize the data acquisition system 230 described above to implement certain aspects thereof.

At (302), the method (300) includes receiving, by one or more processors of a spectrum analyzer from a sensing device, signals provided to an electric machine of an electrical drive system, the signals including a switching noise signal generated by one or more switching components. For instance, the spectrum analyzer can be the spectrum analyzer 240 depicted in FIG. 2. The electric machine and the electric drive can be the electric machine 210 and electric drive 212 of the electrical drive system 208 of FIG. 2. The switching noise signal can be generated by the one or more switching components 218 of the electric drive 212. In some implementations, the electric drive has one or more wide bandgap switching components. As will be appreciated, the signals can include other component signals, such as other noise and environmental signals, and in some instances, a partial discharge signal.

In some implementations, the electric drive is electrically coupled with the electric machine via a multiphase cable. The multiphase cable can include a first cable associated with a first phase, a second cable associated with a second phase, and a third cable associated with a third phase. Thus, the multiphase cable can be a three-phase cable. The multiphase can have any suitable number of phases in other implementations. The sensing device can be an RFCT. The RFCT can be clamped to the first cable, the second cable, and/or the third cable of the multiphase cable. In other implementations, the RFCT can be clamped to grounding leads of the first cable, the second cable, and/or the third cable. In yet other embodiments, the RFCT can be clamped to all phases of the system 200. In this way, the base frequency current can be canceled to avoid current transformer saturation. Further, in yet other implementations, the sensing device is an UHF electromagnetic antenna. The sensing device can sample or sense the signals using a Nyquist sampling rule in which the signals are sampled at a rate that is at least two times a highest signal frequency of interest. In some implementations, the electric machine is operatively coupled with a load machine, such as a propulsor of an aircraft.

At (304), the method (300) includes transforming, by the one or more processors, the signals into a frequency domain. In some implementations, transforming, by the one or more processors, the signals into the frequency domain comprises applying an FFT to the signals. Accordingly, in some implementations, applying the FFT to the signals transforms the signals from a time domain into the frequency domain.

At (306), the method (300) includes determining, by the one or more processors using the signals transformed into the frequency domain, a frequency domain profile for the signals. For instance, in some implementations, method (300) can include maintaining, by the one or more processors, maximum responses of the signals in the frequency domain over a time period. Stated differently, the one or more processors can apply a maximum hold function to the signals over the time period. In such implementations, the frequency domain profile of the switching noise signal (e.g., the first signal 274 in FIG. 3) and the frequency domain profile of at least one other signal (e.g., the second signal 276) are determined based at least in part on the maximum responses of the signals maintained over the period of time. The time period can be preselected or selected so as to allow the maximum responses of the signals in the frequency domain to stabilize within a predetermined margin in shape and amplitude.

At (308), the method (300) includes determining, by the one or more processors, whether a partial discharge signal is included within the signals by discriminating between the switching noise signal and the at least one other signal based at least in part on the frequency domain profile of the switching noise signal and the frequency domain profile of the at least one other signal. In some implementations, for example, the one or more processors discriminate between the switching noise signal and the at least one other signal based at least in part on one or more statistical features associated with the frequency domain profile of the switching noise signal and one or more statistical features associated with the frequency domain profile of the at least one other signal. The one or more statistical features associated with the frequency domain profile of the switching noise signal and the one or more statistical features associated with frequency domain profile of the at least one other signal can include at least one of a mean, variance, skewness, kurtosis, a combination thereof, etc.

In yet other implementations, discriminating between the switching noise signal and the at least one other signal to detect the partial discharge signal at (308) includes classifying, by the one or more processors, the signals using the one or more statistical features associated with the frequency domain profile of the switching noise signal and the one or more statistical features associated with the frequency domain profile of the at least one other signal. In such implementations, at least one of the signals is classified as the switching noise signal and one of the signals is classified as the partial discharge signal.

In yet other implementations, the one or more processors discriminate between the switching noise signal and the at least one other signal based at least in part on a signal occurrence rate associated with the switching noise signal and the frequency domain profile of the at least one other signal. For instance, as noted above, a mode of a spectrum analyzer can be switched to a 3D mode so that the frequency of occurrence of the signals can be presented on a display device for analysis. This allows for detection of hidden and/or sporadic signals that may not be detectable in a 2D frequency domain.

In some implementations, a physics-based approach can be utilized to confirm the detection of the partial discharge. In such implementations, the signals are first signals that are sensed when the electrical drive system is at a first altitude or within a first altitude range. The method (300) can further include receiving, by the one or more processors, second signals from the sensing device. The second signals being sensed when the electrical drive system is at a second altitude or within a second altitude range that is different than the first altitude/first altitude range. The second signals including a second switching noise signal generated by the electric drive, or more specifically, the rapid switching of the switching components thereof. In addition, the method includes transforming, by the one or more processors, the second signals into the frequency domain and determining, by the one or more processors using the second signals transformed into the frequency domain, a frequency domain profile for the second signals. Further, the method includes detecting, by the one or more processors, a second partial discharge signal included within the second signals by discriminating between the second switching noise signal and at least one other signal included within the second signals based at least in part on the frequency domain profile of the second switching noise signal and the frequency domain profile of the at least one other signal included within the second signals.

In such implementations, the method (300) can further include overlaying, by the one or more processors, the frequency domain profile of the first signal and the frequency domain profile of the second signal in a frequency domain spectrum. The method can also include comparing, by the one or more processors, the frequency domain profile of the first signal overlaid with the frequency domain profile of the second signal in the frequency domain spectrum. Then, based on the comparison, the method can include determining, by the one or more processors, whether partial discharge is present. Stated another way, based on the comparison, the method can include determining, by the one or more processors, whether at least one of the partial discharge signal and the second partial discharge signal are actual partial discharge signals. The one or more processors can determine whether at least one of the partial discharge signal and the second partial discharge signal are actual partial discharge signals based at least in part on one or more statistical features associated with the frequency domain profile of the first signal and the frequency domain profile of the second signal.

Figure 7:
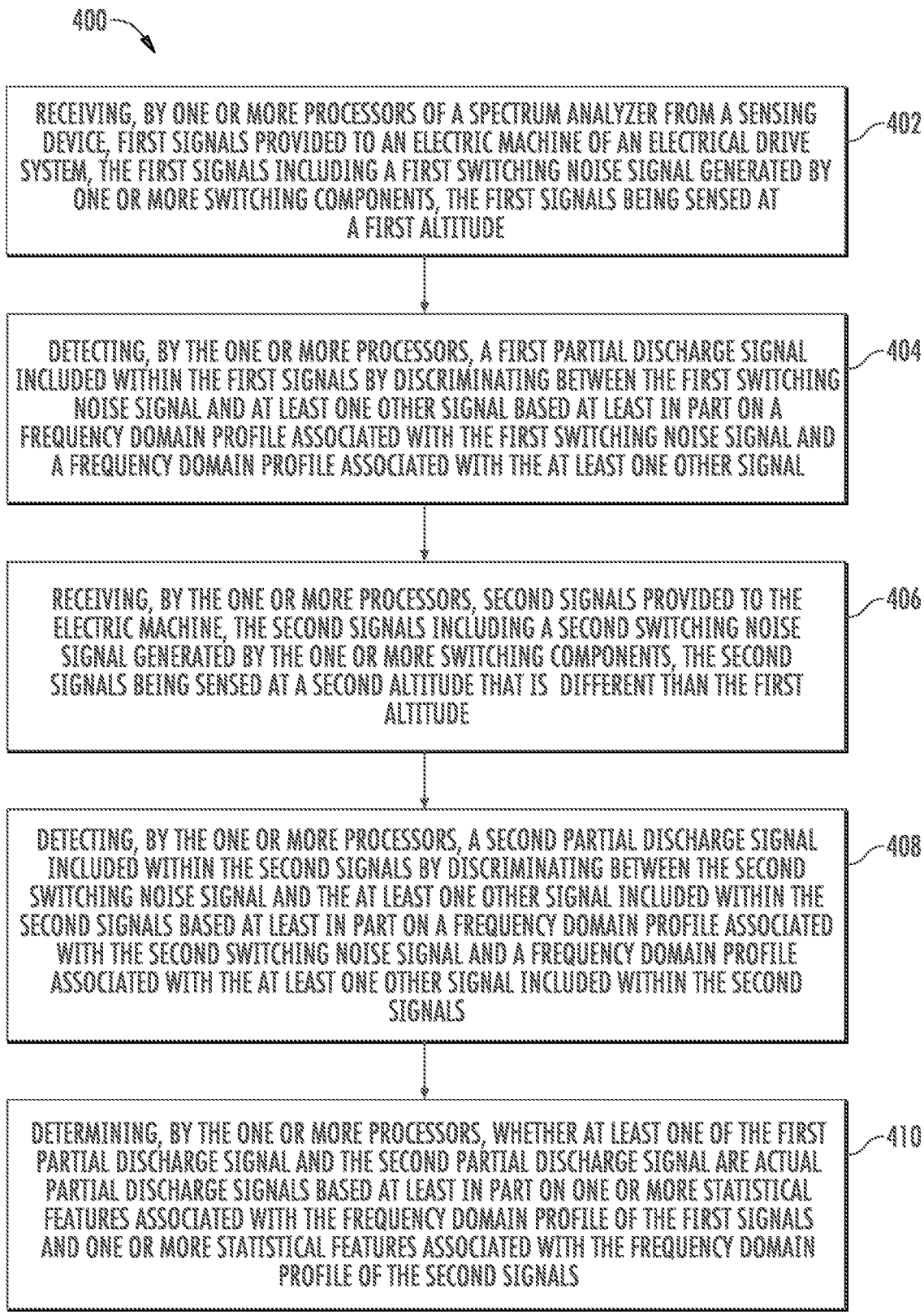
FIG. 7 provides a flow diagram for a method of detecting partial discharge signals in accordance with another exemplary aspect of the present disclosure.

FIG. 7 provides a flow diagram for a method (400) of detecting partial discharge signals associated with an electrical drive system in accordance with an exemplary aspect of the present disclosure. In certain exemplary aspects, the method (400) may utilize the data acquisition system 230 described above to implement certain aspects thereof.

At (402), the method (400) includes receiving, by one or more processors of a spectrum analyzer from a sensing device, first signals provided to an electric machine of an electrical drive system, the first signals including a first switching noise signal generated by an electric drive of the electrical drive system, the first signals being sensed when the electrical drive system is at a first altitude. In some implementations, the electrical drive system is embedded within a propulsion system of an aircraft. For instance, the electrical drive system can be one of the electrical drive systems depicted in FIG. 1. The spectrum analyzer can be a real-time spectrum analyzer, for example.

At (404), the method (400) includes detecting, by the one or more processors, a first partial discharge signal included within the first signals by discriminating between the first switching noise signal and at least one other signal included within the first signals based at least in part on a frequency domain profile associated with the first switching noise signal and a frequency domain profile associated with the at least one other signal.

At (406), the method (400) includes receiving, by the one or more processors, second signals provided to the electric machine, the second signals including a second switching noise signal generated by the electric drive, the second signals being sensed when the electrical drive system is at a second altitude that is different than the first altitude. In some implementations, the first altitude is at least 1,000 ft different than the second altitude. In yet other implementations, the first altitude is less than 30,000 ft and the second altitude is greater than 30,000 ft.

At (408), the method (400) includes detecting, by the one or more processors, a second partial discharge signal included within the second signals by discriminating between the second switching noise signal and at least one other signal included within the second signals based at least in part on a frequency domain profile associated with the second switching noise signal and a frequency domain profile associated with the at least one other signal included within the second signals.

At (410), the method (400) includes determining, by the one or more processors, whether partial discharge is present. Particularly, the method (400) includes determining whether at least one of the first partial discharge signal and the second partial discharge signal are actual partial discharge signals based at least in part on one or more statistical features associated with the frequency domain profile of the first signal and the frequency domain profile of the second signal. In in this regard, the presence of partial discharge can be detected without passing the first signals or the second signals through a filter.

Figure 8:
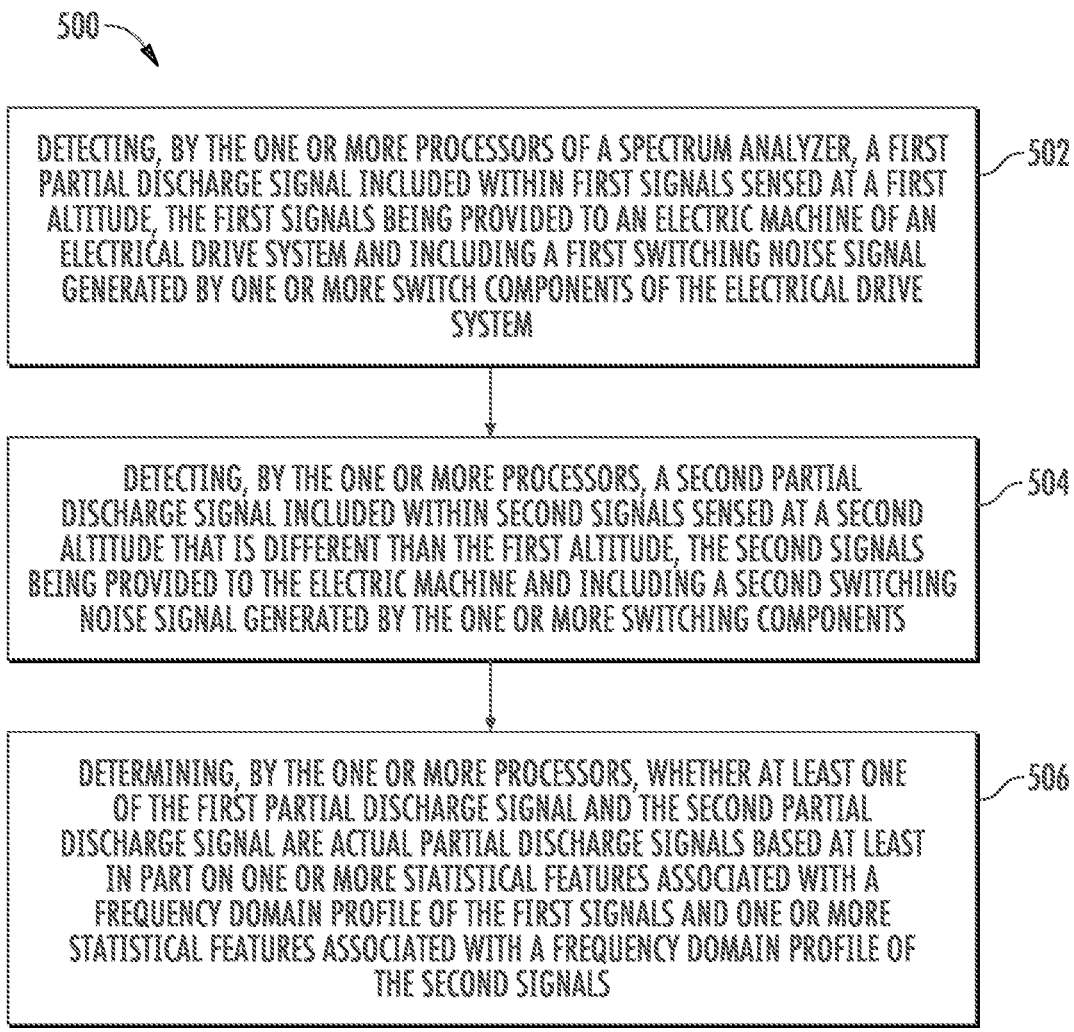
FIG. 8 provides a flow diagram for a method of detecting partial discharge signals in accordance with a further exemplary aspect of the present disclosure.

FIG. 8 provides a flow diagram for a method (500) of detecting partial discharge signals associated with an electrical drive system in accordance with an exemplary aspect of the present disclosure. In certain exemplary aspects, the method (500) may utilize the data acquisition system 230 described above to implement certain aspects thereof.

At (502), the method (500) includes detecting, by one or more processors of a spectrum analyzer, a first partial discharge signal included within first signals sensed when the electrical drive system is at a first altitude, the first signals being provided to an electric machine of an electrical drive system and including a first switching noise signal generated by an electric drive of the electrical drive system.

At (504), the method (500) includes detecting, by the one or more processors, a second partial discharge signal included within second signals sensed when the electrical drive system is at a second altitude that is different than the first altitude, the second signals being provided to the electric machine and including a second switching noise signal generated by the electric drive.

At (506), the method (500) includes determining, by the one or more processors, whether at least one of the first partial discharge signal and the second partial discharge signal are actual partial discharge signals based at least in part on one or more statistical features associated with a frequency domain profile of the first signals and one or more statistical features associated with a frequency domain profile of the second signals. For instance, the one or more statistical features associated with the frequency domain profile of the first signals can be compared with the one or more statistical features associated with the frequency domain profile of the second signals. Based on such a comparison, it may be determined if partial discharge is present within the electrical system.

In some example embodiments, an aircraft equipped with the system 200 of FIG. 2 is provided. In such example embodiments, PD online detection may proceed as follows. Prior to performing a PD detection analysis, the system is equipped with knowledge relating to the switching noise frequency profile(s) associated with the switching components. In some embodiments, the spectrum may span from very low frequency (e.g., in the kHz range) up to relatively high frequency (e.g., up to 150 MHz for SiC switching devices). A PD online detection analysis can be implemented when a "quiet zone" appears to search for PD in the 2D domain (e.g., in the 2D signal power vs. frequency domain). Given an online measurement at certain ambient conditions, if the frequency 2D profile is significantly different than the general switching noise related profile, PD may be present. Statistical analysis can be implemented to determine whether the measured spectrum contains switching noise features or if PD is present.

Furthermore, additional PD online measurements can be performed at other altitude(s), particularly where suspicious new frequency features change with altitude. These additional measurements or tests can confirm the presence of PD. In the event no new frequency features are detected beyond the general switching frequency fingerprint or profile, a 3D domain analysis can be performed (e.g., a power & signal occurrence rate vs. frequency domain) to confirm whether there is a hidden suspicious PD signal beneath the switching frequency profile, e.g., as illustrated in FIG. 4. If such a hidden signal is detected, additional online measurements can be performed to check the behavior of the hidden signal at different altitudes.

In one example embodiment, an aircraft is provided. The aircraft includes an electrical drive system having an electric machine, a propulsor operatively coupled to the electric machine, and an electric drive electrically coupled with the electric machine. Further, the aircraft includes a sensing device and a computing system having one or more memory devices and one or more processors. The one or more processors are configured to detect a first partial discharge signal included within first signals sensed by the sensing device when the aircraft is at a first altitude, the first signals being provided to the electric machine and including a first switching noise signal generated by one or more switching components of the electrical drive system. Further, the one or more processors are configured detect a second partial discharge signal included within second signals sensed when the aircraft is at a second altitude that is different than the first altitude, the second signals being provided to the electric machine and including a second switching noise signal generated by the one or more switching components. In addition, the one or more processors are configured determine whether at least one of the first partial discharge signal and the second partial discharge signal are actual partial discharge signals based at least in part on a comparison of one or more statistical features associated with a frequency domain profile of the first signals and one or more statistical features associated with a frequency domain profile of the second signals.

In another example embodiment, an aircraft is provided. The aircraft includes an electrical drive system having an electric machine, a propulsor operatively coupled to the electric machine, and an electric drive electrically coupled with the electric machine. Further, the aircraft includes a sensing device and a computing system having one or more memory devices and one or more processors. The one or more processors are configured to detect a first partial discharge signal included within first signals sensed by the sensing device at a first time when the aircraft is at a first altitude or within a first altitude range, the first signals being provided to the electric machine and including a first switching noise signal generated by one or more switching components of the electrical drive system. Further, the one or more processors are configured to detect a second partial discharge signal included within second signals sensed at a second time when the aircraft is at the first altitude or within the first altitude range, the second time being later in time than the first time, the second signals being provided to the electric machine and including a second switching noise signal generated by the one or more switching components. In addition, the one or more processors are configured to determine whether at least one of the first partial discharge signal and the second partial discharge signal are actual partial discharge signals based at least in part on a comparison of one or more statistical features associated with a frequency domain profile of the first partial discharge signal and one or more statistical features associated with a frequency domain profile of the second partial discharge signal. In such embodiments, the aircraft is ascending to a preselected altitude range at the first time and descending at the second time. In this regard, the partial discharge signal at a given pressure can be checked while ascending, e.g., to a preselected altitude range, and then again at the same pressure while descending, e.g., from the preselected altitude range. Statistical consistencies and/or inconsistencies in the first and second signals can be identified and used to determine the likelihood that partial discharge has occurred.

In a further example embodiment, a non-transitory computer readable medium is provided. The non-transitory computer readable medium comprises computer-executable instructions, which, when executed by one or more processors of a spectrum analyzer, cause the one or more processors to: detect a first partial discharge signal included within first signals sensed by a sensing device at a first altitude, the first signals including a first switching noise signal generated by one or more switching components of an electrical drive system that includes an electric drive electrically coupled with an electric machine; detect a second partial discharge signal included within second signals sensed by the sensing device at a second altitude that is different than the first altitude, the second signals including a second switching noise signal generated by the one or more switching components; and determine whether at least one of the first partial discharge signal and the second partial discharge signal are actual partial discharge signals based at least in part on a comparison of one or more statistical features associated with a frequency domain profile of the first signals and one or more statistical features associated with a frequency domain profile of the second signals.

In another example embodiment, a non-transitory computer readable medium is provided. The non-transitory computer readable medium comprises computer-executable instructions, which, when executed by one or more processors of a spectrum analyzer, cause the one or more processors to: receive signals from a sensing device, the signals including a switching noise signal generated by one or more switching components of an electrical drive system that includes an electric drive and an electric machine; transform the signals into a frequency domain; determine, using the signals transformed into the frequency domain, a frequency domain profile for the signals; and detect a partial discharge signal included within the signals by discriminating between the switching noise signal and at least one other signal based at least in part on the frequency domain profile of the switching noise signal and the frequency domain profile of the at least one other signal. The at least one other signal can be selected for discrimination analysis based on a preliminary analysis indicating that the at least one other signal exhibits an inconsistent frequency domain profile relative to expected switching noise, environmental, and/or other signal responses for the given operating conditions.

Figure 9:
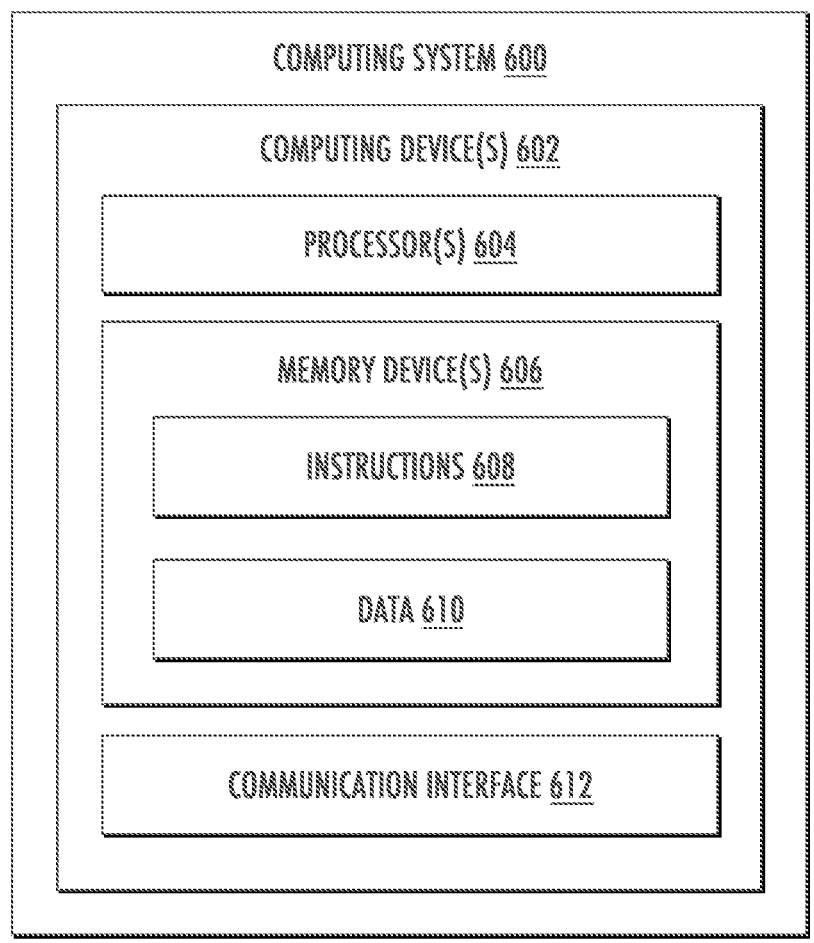
FIG. 9 is a block diagram of an example computing system that can be used to implement aspects of the present disclosure.

FIG. 9 provides a block diagram of a computing system 600 in accordance with exemplary aspects of the present disclosure. The computing system 600 is one example of a suitable computing system for implementing certain aspects of the present disclosure. For instance, the computing system 250 of the spectrum analyzer 240 (FIG. 2) can be configured in a similar manner as the computing system 600 of FIG. 9. Furthermore, the controller 228 can include some or all of the computing components of the computing system 600 of FIG. 9.

As shown in FIG. 9, the computing system 600 can include one or more processor(s) 604 and one or more memory device(s) 606. The one or more processor(s) 604 and one or more memory device(s) 606 can be embodied in one or more computing device(s) 602. The one or more processor(s) 604 can include any suitable processing device, such as a microprocessor, microcontroller, integrated circuit, logic device, or other suitable processing device. The one or more memory device(s) 606 can include one or more computer-readable medium, including, but not limited to, non-transitory computer-readable medium or media, RAM, ROM, hard drives, flash drives, and other memory devices, such as one or more buffer devices.

The one or more memory device(s) 606 can store information accessible by the one or more processor(s) 604, including computer-readable instructions 608 that can be executed by the one or more processor(s) 604. The instructions 608 can be any set of instructions that, when executed by the one or more processor(s) 604, cause the one or more processor(s) 604 to perform operations. The instructions 608 can be software written in any suitable programming language or can be implemented in hardware. The instructions 608 can be any of the computer-readable instructions noted herein.

The memory device(s) 606 can further store data 610 that can be accessed by the processor(s) 604. For example, the data 610 can include received sensor data, a data set of known signal profiles, etc. Further, the data 610 can include one or more table(s), function(s), algorithm(s), model(s), equation(s), etc. according to example embodiments of the present disclosure.

The one or more computing device(s) 602 can also include a communication interface 612 used to communicate, for example, with other components, systems, or devices. The communication interface 612 can include any suitable components for interfacing with one or more network(s), including for example, transmitters, receivers, ports, controllers, antennas, or other suitable components.

The technology discussed herein makes reference to computer-based systems and actions taken by and information sent to and from computer-based systems. It will be appreciated that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they include structural elements that do not differ from the literal language of the claims or if they include equivalent structural elements with insubstantial differences from the literal language of the claims.

Additional exemplary aspects will be described below with respect to the following clauses:

1. A system, comprising: an electrical drive system having an electric machine and an electric drive electrically coupled with the electric machine; a sensing device operable to sense signals associated with the electrical drive system, the signals including a switching noise signal generated by one or more switching components of the electrical drive system; a computing system having one or more memory devices and one or more processors, the one or more processors being configured to: receive the signals from the sensing device; transform the signals into a frequency domain; determine, using the signals transformed into the frequency domain, a frequency domain profile for the signals; and determine whether a partial discharge signal is present within the signals by discriminating between the switching noise signal and at least one other signal included within the signals based at least in part on the frequency domain profile of the switching noise signal and the frequency domain profile of the at least one other signal.

2. The system of any preceding clause, wherein the one or more processors are configured to discriminate between the switching noise signal and the at least one other signal based at least in part on one or more statistical features associated with the frequency domain profile of the switching noise signal and the frequency domain profile of the at least one other signal.

3. The system of any preceding clause, wherein the one or more statistical features associated with the frequency domain profile of the switching noise signal and the one or more statistical features associated with the frequency domain profile of the at least one other signal include at least one of a mean, variance, skewness, and kurtosis.

4. The system of any preceding clause, wherein in discriminating between the switching noise signal and the at least one other signal to determine whether the partial discharge signal is present within the signals, the one or more processors are configured to: classify the signals using the one or more statistical features associated with the frequency domain profile of the switching noise signal and using the one or more statistical features associated with the frequency domain profile of the at least one other signal, and wherein at least one of the signals is classified as the switching noise signal and one of the signals is classified as the partial discharge signal.

5. The system of any preceding clause, wherein the one or more processors are configured to discriminate between the switching noise signal and the at least one other signal based at least in part on a signal occurrence rate associated with the switching noise signal and the frequency domain profile of the at least one other signal.

6. The system of any preceding clause wherein the one or more processors transform the signals into the frequency domain by applying a Fast Fourier Transform to the signals.

7. The system of any preceding clause, wherein the one or more processors are further configured to: maintain maximum responses of the signals in the frequency domain over a time period, and wherein the frequency domain profile of the at least one other signal and the frequency domain profile of the switching noise signal are determined based at least in part on the maximum responses of the signals maintained over the time period.
8. The system of any preceding clause, wherein the time period is preselected so as to allow the maximum responses of the signals in the frequency domain to stabilize within a predetermined margin in shape and amplitude.
9. The system of any preceding clause, wherein the sensing device samples the signals using a Nyquist sampling rule in which the signals are sampled at a rate that is at least two times a highest signal frequency of interest.
10. The system of any preceding clause, wherein the electric machine is operatively coupled with a load machine, and wherein the load machine is a propulsor of an aircraft.
11. The system of any preceding clause, wherein the signals are first signals that are sensed when the electrical drive system is within a first altitude range, and wherein the one or more processors are further configured to: receive second signals from the sensing device, the second signals being sensed when the electrical drive system is within a second altitude range that is different than the first altitude range, the second signals including a second switching noise signal generated by the one or more switching components; transform the second signals into the frequency domain; determine, using the second signals transformed into the frequency domain, a frequency domain profile for the second signals; and determine whether a second partial discharge signal is present within the second signals by discriminating between the second switching noise signal and at least one other signal included within the second signals based at least in part on the frequency domain profile of the second switching noise signal and the frequency domain profile of the at least one other signal included within the second signals.
12. The system of any preceding clause, wherein the one or more processors are further configured to: overlay the frequency domain profile of the first signals and the frequency domain profile of the second signals in a frequency domain spectrum; compare the frequency domain profile of the first signals overlaid with the frequency domain profile of the second signals in the frequency domain spectrum; and based on the comparison, determine whether at least one of the partial discharge signal and the second partial discharge signal are actual partial discharge signals.
13. The system of any preceding clause, wherein the one or more processors are configured to determine whether at least one of the partial discharge signal and the second partial discharge signal is an actual partial discharge signal based at least in part on one or more statistical features associated with the frequency domain profile of the first signals and one or more statistical features associated with the frequency domain profile of the second signals.
14. A method, comprising: receiving, by one or more processors of a real-time spectrum analyzer from a sensing device, signals associated with an electrical drive system having an electric machine and an electric drive electrically coupled thereto, the signals including a switching noise signal generated by one or more switching components of the electrical drive system; transforming, by the one or more processors, the signals into a frequency domain; determining, by the one or more processors using the signals transformed into the frequency domain, a frequency domain profile for the signals; and determining, by the one or more processors, whether a partial discharge signal is included within the signals by discriminating between the switching noise signal and at least one other signal included within the signals based at least in part on the frequency domain profile of the switching noise signal and the frequency domain profile of the at least one other signal.
15. The method of any preceding clause, wherein the one or more processors discriminate between the switching noise signal and the at least one other signal based at least in part on one or more statistical features associated with the frequency domain profile of the switching noise signal and the frequency domain profile of the at least one other signal.
16. The method of any preceding clause, wherein the one or more statistical features associated with the frequency domain profile of the switching noise signal and the one or more statistical features associated with the frequency domain profile of the at least one other signal include at least one of a mean, variance, skewness, and kurtosis.
17. The method of any preceding clause, wherein discriminating between the switching noise signal and the at least one other signal to determine whether the partial discharge signal is included within the signals comprises: classifying, by the one or more processors, the signals using the one or more statistical features associated with the frequency domain profile of the switching noise signal and the one or more statistical features associated with the frequency domain profile of the at least one other signal, and wherein at least one of the signals is classified as the switching noise signal and one of the signals is classified as the partial discharge signal.
18. The method of any preceding clause, wherein the one or more processors discriminate between the switching noise signal and the at least one other signal based at least in part on a signal occurrence rate associated with the switching noise signal and the frequency domain profile of the at least one other signal.
19. The method of any preceding clause, further comprising: maintaining, by the one or more processors, maximum responses of the signals in the frequency domain over a time period, and wherein the frequency domain profile of the at least one other signal and the frequency domain profile of the switching noise signal are determined based at least in part on the maximum responses of the signals maintained over the time period, and wherein the time period is preselected so as to allow the maximum responses of the signals in the frequency domain to stabilize within a predetermined margin in shape and amplitude.
20. A non-transitory computer readable medium comprising computer-executable instructions, which, when executed by one or more processors of a spectrum analyzer, cause the one or more processors to: receive a first signal detected at a first altitude, the first signal indicating a presence of partial discharge and including a first switching noise signal generated by one or more switching components of an electrical drive system having an electric drive electrically coupled with an electric machine; receive a second signal detected at a second altitude that is different than the first altitude, the second signal indicating a presence of partial discharge and including a second switching noise signal generated by the one or more switching components; and determine whether partial discharge is present based at least in part on a comparison of one or more statistical features associated with a frequency domain profile of the first signal and one or more statistical features associated with a frequency domain profile of the second signal.

21. A method, comprising: receiving, by one or more processors of a spectrum analyzer from a sensing device, first signals provided to an electric machine of an electrical drive system, the first signals including a first switching noise signal generated by one or more switching components of the electrical drive system, the first signals being sensed when the electrical drive system is at a first altitude; detecting, by the one or more processors, a first partial discharge signal included within the first signals by discriminating between the first switching noise signal and the first partial discharge signal based at least in part on a frequency domain profile associated with the first switching noise signal and a frequency domain profile associated with the first partial discharge signal; receiving, by the one or more processors, second signals provided to the electric machine, the second signals including a second switching noise signal generated by the one or more switching components, the second signals being sensed when the electrical drive system is at a second altitude that is different than the first altitude; detecting, by the one or more processors, a second partial discharge signal included within the second signals by discriminating between the second switching noise signal and the second partial discharge signal based at least in part on a frequency domain profile associated with the second switching noise signal and a frequency domain profile associated with the second partial discharge signal; and determining, by the one or more processors, whether at least one of the first partial discharge signal and the second partial discharge signal are actual partial discharge signals based at least in part on one or more statistical features associated with the frequency domain profile of the first partial discharge signal and the frequency domain profile of the second partial discharge signal.

22. The method of any preceding clause, wherein the first altitude is at least 1,000 ft different than the second altitude.

23. The method of any preceding clause, wherein the first altitude is less than 30,000 ft and the second altitude is greater than 30,000 ft.

24. The method of any preceding clause, wherein the electrical drive system is embedded within a propulsion system of an aircraft.

25. The method of any preceding clause, wherein the first partial discharge signal and the second partial discharge signal are detected without passing the first signals or the second signals through a filter.

26. A method, comprising: detecting, by one or more processors of a spectrum analyzer, a first partial discharge signal included within first signals sensed when the electrical drive system is at a first altitude, the first signals being provided to an electric machine of an electrical drive system and including a first switching noise signal generated by one or more switching components of the electrical drive system that includes an electric drive electrically coupled with the electric machine; detecting, by the one or more processors, a second partial discharge signal included within second signals sensed when the electrical drive system is at a second altitude that is different than the first altitude, the second signals being provided to the electric machine and including a second switching noise signal generated by the one or more switching components; and determining, by the one or more processors, whether at least one of the first partial discharge signal and the second partial discharge signal are actual partial discharge signals based at least in part on one or more statistical features associated with a frequency domain profile of the first partial discharge signal and a frequency domain profile of the second partial discharge signal.

27. An aircraft, comprising: an electrical drive system having an electric machine, a propulsor operatively coupled to the electric machine, and an electric drive electrically coupled with the electric machine; a sensing device; a computing system having one or more memory devices and one or more processors, the one or more processors being configured to: detect a first partial discharge signal included within first signals sensed by the sensing device when the aircraft is at a first altitude, the first signals being provided to the electric machine and including a first switching noise signal generated by one or more switching components of the electrical drive system; detect a second partial discharge signal included within second signals sensed when the aircraft is at a second altitude that is different than the first altitude, the second signals being provided to the electric machine and including a second switching noise signal generated by the one or more switching components; and determine whether at least one of the first partial discharge signal and the second partial discharge signal are actual partial discharge signals based at least in part on a comparison of one or more statistical features associated with a frequency domain profile of the first partial discharge signal and a frequency domain profile of the second partial discharge signal.

28. A non-transitory computer readable medium comprising computer-executable instructions, which, when executed by one or more processors of a spectrum analyzer, cause the one or more processors to: detect a first partial discharge signal included within first signals sensed by a sensing device at a first altitude, the first signals including a first switching noise signal generated by one or more switching components; detect a second partial discharge signal included within second signals sensed by the sensing device at a second altitude that is different than the first altitude, the second signals including a second switching noise signal generated by the one or more switching components; and determine whether at least one of the first partial discharge signal and the second partial discharge signal are actual partial discharge signals based at least in part on a comparison of one or more statistical features associated with a frequency domain profile of the first partial discharge signal and a frequency domain profile of the second partial discharge signal.

29. A non-transitory computer readable medium comprising computer-executable instructions, which, when executed by one or more processors of a spectrum analyzer, cause the one or more processors to: receive signals from a sensing device, the signals including a switching noise signal generated by one or more switching components; transform the signals into a frequency domain; determine, using the signals transformed into the frequency domain, a frequency domain profile for the signals; and detect a partial discharge signal included within the signals by discriminating between the switching noise signal and the partial discharge signal based at least in part on the frequency domain profile of the switching noise signal and the frequency domain profile of the partial discharge signal.

30. An aircraft, comprising: an electrical drive system having an electric machine, a propulsor operatively coupled to the electric machine, and an electric drive electrically coupled with the electric machine; a sensing device; a computing system having one or more memory devices and one or more processors, the one or more processors being configured to: detect a first partial discharge signal included within first signals sensed by the sensing device at a first time when the aircraft is at a first altitude or within a first altitude range, the first signals being provided to the electric machine and including a first switching noise signal generated by one or more switching components; detect a second partial discharge signal included within second signals sensed at a second time when the aircraft is at the first altitude or within the first altitude range, the second time being later in time than the first time, the second signals being provided to the electric machine and including a second switching noise signal generated by the one or more switching components; and determine whether at least one of the first partial discharge signal and the second partial discharge signal are actual partial discharge signals based at least in part on a comparison of one or more statistical features associated with a frequency domain profile of the first partial discharge signal and a frequency domain profile of the second partial discharge signal.

31. The aircraft of any preceding clause, wherein the aircraft is ascending to a preselected altitude range at the first time and descending at the second time.

What is claimed is:

1. A system, comprising:
an electrical drive system having an electric machine and an electric drive electrically coupled with the electric machine;
a sensing device having a sensing element operable to sense signals associated with the electrical drive system, the signals representing an unfiltered output from the sensing element, the signals including a switching noise signal generated by one or more switching components of the electrical drive system;
a computing system having one or more memory devices and one or more processors, the one or more processors being configured to:
receive the signals from the sensing device, wherein the signals received from the sensing device are not filtered by the sensing device before being received by the computing system, and wherein the signals are directly input into the computing system from the sensing device;
transform the signals into a frequency domain;
determine, using the signals transformed into the frequency domain, a frequency domain profile for the signals; and
determine whether a partial discharge signal is present within the signals by discriminating between the switching noise signal and at least one other signal included within the signals based at least in part on the frequency domain profile of the switching noise signal and the frequency domain profile of the at least one other signal.

2. The system of claim 1, wherein the one or more processors are configured to discriminate between the switching noise signal and the at least one other signal based at least in part on one or more statistical features associated with the frequency domain profile of the switching noise signal and the frequency domain profile of the at least one other signal.

3. The system of claim 2, wherein the one or more statistical features associated with the frequency domain profile of the switching noise signal and the one or more statistical features associated with the frequency domain profile of the at least one other signal include at least one of a mean, variance, skewness, and kurtosis.

4. The system of claim 2, wherein in discriminating between the switching noise signal and the at least one other signal to determine whether the partial discharge signal is present within the signals, the one or more processors are configured to:
classify the signals using the one or more statistical features associated with the frequency domain profile of the switching noise signal and using the one or more statistical features associated with the frequency domain profile of the at least one other signal, and
wherein at least one of the signals is classified as the switching noise signal and one of the signals is classified as the partial discharge signal.

5. The system of claim 1, wherein the one or more processors are configured to discriminate between the switching noise signal and the at least one other signal based at least in part on a signal occurrence rate associated with the switching noise signal and the frequency domain profile of the at least one other signal.

6. The system of claim 1, wherein the one or more processors transform the signals into the frequency domain by applying a Fast Fourier Transform to the signals.

7. The system of claim 1, wherein the one or more processors are further configured to:
maintain maximum responses of the signals in the frequency domain over a time period, and
wherein the frequency domain profile of the at least one other signal and the frequency domain profile of the switching noise signal are determined based at least in part on the maximum responses of the signals maintained over the time period.

8. The system of claim 7, wherein the time period is preselected so as to allow the maximum responses of the signals in the frequency domain to stabilize within a predetermined margin in shape and amplitude.

9. The system of claim 1, wherein the sensing device samples the signals using a Nyquist sampling rule in which the signals are sampled at a rate that is at least two times a highest signal frequency of interest.

10. The system of claim 1, wherein the signals are first signals that are sensed when the electrical drive system is within a first altitude range, and wherein the one or more processors are further configured to:
receive second signals from the sensing device, the second signals being sensed when the electrical drive system is within a second altitude range that is different than the first altitude range, the second signals including a second switching noise signal generated by the one or more switching components;
transform the second signals into the frequency domain;

determine, using the second signals transformed into the frequency domain, a frequency domain profile for the second signals; and determine whether a second partial discharge signal is present within the second signals by discriminating between the second switching noise signal and at least one other signal included within the second signals based at least in part on the frequency domain profile of the second switching noise signal and the frequency domain profile of the at least one other signal included within the second signals.

11. The system of claim 10, wherein the one or more processors are further configured to:

overlay the frequency domain profile of the first signals and the frequency domain profile of the second signals in a frequency domain spectrum;

compare the frequency domain profile of the first signals overlaid with the frequency domain profile of the second signals in the frequency domain spectrum; and based on the comparison, determine whether at least one of the partial discharge signal and the second partial discharge signal are actual partial discharge signals.

12. The system of claim 10, wherein the one or more processors are configured to determine whether at least one of the partial discharge signal and the second partial discharge signal is an actual partial discharge signal based at least in part on one or more statistical features associated with the frequency domain profile of the first signals and one or more statistical features associated with the frequency domain profile of the second signals.

13. A method, comprising:

receiving, by one or more processors of a real-time spectrum analyzer from a sensing device, signals associated with an electrical drive system having an electric machine and an electric drive electrically coupled thereto, the signals received from the sensing device are not filtered by the sensing device before being received by the one or more processors, the signals representing an unfiltered output from a sensing element of the sensing device, the signals including a switching noise signal generated by one or more switching components of the electrical drive system, wherein the signals are directly input into the real-time spectrum analyzer from the sensing device;

transforming, by the one or more processors, the signals into a frequency domain;

determining, by the one or more processors using the signals transformed into the frequency domain, a frequency domain profile for the signals; and determining, by the one or more processors, whether a partial discharge signal is included within the signals by discriminating between the switching noise signal and at least one other signal included within the signals based at least in part on the frequency domain profile of the switching noise signal and the frequency domain profile of the at least one other signal.

14. The method of claim 13, wherein the one or more processors discriminate between the switching noise signal and the at least one other signal based at least in part on one or more statistical features associated with the frequency domain profile of the switching noise signal and the frequency domain profile of the at least one other signal.

15. The method of claim 14, wherein the one or more statistical features associated with the frequency domain profile of the switching noise signal and the one or more statistical features associated with the frequency domain profile of the at least one other signal include at least one of a mean, variance, skewness, and kurtosis.

16. The method of claim 15, wherein discriminating between the switching noise signal and the at least one other signal to determine whether the partial discharge signal is included within the signals comprises:

classifying, by the one or more processors, the signals using the one or more statistical features associated with the frequency domain profile of the switching noise signal and the one or more statistical features associated with the frequency domain profile of the at least one other signal, and wherein at least one of the signals is classified as the switching noise signal and one of the signals is classified as the partial discharge signal.

17. The method of claim 13, wherein the one or more processors discriminate between the switching noise signal and the at least one other signal based at least in part on a signal occurrence rate associated with the switching noise signal and the frequency domain profile of the at least one other signal.

18. The method of claim 13, further comprising:

maintaining, by the one or more processors, maximum responses of the signals in the frequency domain over a time period, and wherein the frequency domain profile of the at least one other signal and the frequency domain profile of the switching noise signal are determined based at least in part on the maximum responses of the signals maintained over the time period, and wherein the time period is preselected so as to allow the maximum responses of the signals in the frequency domain to stabilize within a predetermined margin in shape and amplitude.

19. An electrical drive system for an aircraft, comprising:
an electric machine;
an electric drive electrically coupled with the electric machine;
a computing system having one or more memory devices and one or more processors being configured to:
receive a first signal, the first signal being detected at a first time and at a preselected altitude range, the first signal indicating a presence of partial discharge and including a first switching noise signal generated by one or more switching components of the electric drive;
receive a second signal detected at a second time and at the preselected altitude range, wherein the second time is different than the first time, the second signal indicating a presence of partial discharge and including a second switching noise signal generated by the one or more switching components, and wherein the aircraft is ascending within the preselected altitude range at the first time and descending at the second time; and
determine whether partial discharge is present based at least in part on a comparison of one or more statistical features associated with a frequency domain profile of the first signal and one or more statistical features associated with a frequency domain profile of the second signal.

20. The system of claim 1, wherein the one or more processors determines whether a partial discharge signal is present within the signals without signal triggering or passing the signals through a filter.

* * * * *